US010283215B2

(12) United States Patent
Marelli et al.

(10) Patent No.: US 10,283,215 B2
(45) Date of Patent: May 7, 2019

(54) NONVOLATILE MEMORY SYSTEM WITH BACKGROUND REFERENCE POSITIONING AND LOCAL REFERENCE POSITIONING

(71) Applicant: IP GEM GROUP, LLC, Irvine, CA (US)

(72) Inventors: Alessia Marelli, Dalmine (IT); Rino Micheloni, Turate (IT); Ron Cohen, Tel Aviv (IL); Amir Mosek, Tel Aviv (IL); Eran Kirzner, Moshav Elishama (IL)

(73) Assignee: IP GEM GROUP, LLC, Irvine, CA (US)

( * ) Notice: Subject to any disclaimer, the term of this patent is extended or adjusted under 35 U.S.C. 154(b) by 175 days.

(21) Appl. No.: 15/655,518

(22) Filed: Jul. 20, 2017

(65) Prior Publication Data

US 2018/0033490 A1 Feb. 1, 2018

Related U.S. Application Data

(60) Provisional application No. 62/378,145, filed on Aug. 22, 2016, provisional application No. 62/367,789, filed on Jul. 28, 2016.

(51) Int. Cl.
*G11C 29/50* (2006.01)
*G06F 11/07* (2006.01)
(Continued)

(52) U.S. Cl.
CPC ...... *G11C 29/50004* (2013.01); *G06F 11/076* (2013.01); *G11C 16/26* (2013.01);
(Continued)

(58) Field of Classification Search
CPC ..... G11C 16/349; G11C 29/028; G11C 29/50; G11C 29/50004
See application file for complete search history.

(56) References Cited

U.S. PATENT DOCUMENTS 815,137 A 3/1906 Beecher
5,615,235 A 3/1997 Kakuishi et al.
(Continued)

OTHER PUBLICATIONS

NVM Express, revision 1.0; Intel Corporation;, Jul. 12, 2011, pp. 103-106 and 110-114.
(Continued)

*Primary Examiner* — Steve N Nguyen
(74) *Attorney, Agent, or Firm* — Glass & Associates; Kenneth Glass

(57) ABSTRACT

A nonvolatile memory system, a nonvolatile memory controller and a method for reducing latency of a memory controller are disclosed. The nonvolatile memory system includes a read circuit that performs background reads of an indicator page of each block to identify outlier blocks. A background reference positioning circuit performs background reads of representative pages of the outlier block at threshold voltage offsets to identify sets of updated threshold voltage offset values. Upon endurance events, retention timer events and read disturb events at a closed block background reads are performed of representative pages of the closed block at threshold voltage offsets to identify sets of updated threshold voltage offset values. When a usage characteristic meets one or more usage characteristic threshold, the read circuit performs subsequent host-requested reads of pages of blocks meeting the usage characteristic threshold using a threshold voltage shift read instruction and using the corresponding set of updated threshold voltage offset values.

20 Claims, 9 Drawing Sheets

(51) Int. Cl.
*G11C 16/26* (2006.01)
*G11C 16/34* (2006.01)
*G11C 29/52* (2006.01)
*G11C 29/02* (2006.01)
*G11C 29/12* (2006.01)
*G11C 29/44* (2006.01)
*G11C 29/46* (2006.01)
*G11C 11/56* (2006.01)
*G11C 29/26* (2006.01)
*G11C 29/04* (2006.01)

(52) U.S. Cl.
CPC ...... *G11C 16/3427* (2013.01); *G11C 16/3495* (2013.01); *G11C 29/021* (2013.01); *G11C 29/028* (2013.01); *G11C 29/12005* (2013.01); *G11C 29/4401* (2013.01); *G11C 29/46* (2013.01); *G11C 29/50016* (2013.01); *G11C 29/52* (2013.01); *G11C 11/5642* (2013.01); *G11C 16/349* (2013.01); *G11C 29/26* (2013.01); *G11C 2029/0409* (2013.01); *G11C 2029/0411* (2013.01); *G11C 2029/1202* (2013.01); *G11C 2029/4402* (2013.01); *G11C 2029/5002* (2013.01)

(56) References Cited

U.S. PATENT DOCUMENTS

| | | |
|---|---|---|
| 5,732,092 A | 3/1998 | Shinohara |
| 5,822,244 A | 10/1998 | Hansen et al. |
| 5,875,343 A | 2/1999 | Binford et al. |
| 6,115,788 A | 9/2000 | Thowe |
| 6,148,360 A | 11/2000 | Leak et al. |
| 6,412,041 B1 | 6/2002 | Lee et al. |
| 6,539,515 B1 | 3/2003 | Gong |
| 6,567,313 B2 | 5/2003 | Tanaka et al. |
| 6,633,856 B2 | 10/2003 | Richardson et al. |
| 6,725,409 B1 | 4/2004 | Wolf |
| 6,789,227 B2 | 9/2004 | De Souza et al. |
| 6,871,168 B1 | 3/2005 | Tanaka et al. |
| 6,895,547 B2 | 5/2005 | Eleftheriou et al. |
| 6,934,804 B2 | 8/2005 | Hashemi |
| 6,963,507 B2 | 11/2005 | Tanaka et al. |
| 6,976,194 B2 | 12/2005 | Cypher |
| 6,976,197 B2 | 12/2005 | Faust et al. |
| 7,032,081 B1 | 4/2006 | Gefen et al. |
| 7,050,334 B2 | 5/2006 | Kim et al. |
| 7,116,732 B2 | 10/2006 | Worm et al. |
| 7,206,992 B2 | 4/2007 | Xin et al. |
| 7,209,527 B2 | 4/2007 | Smith et al. |
| 7,237,183 B2 | 6/2007 | Xin |
| 7,324,559 B2 | 1/2008 | McGibney |
| 7,376,015 B2 | 5/2008 | Tanaka et al. |
| 7,450,668 B2 | 11/2008 | Ghosh et al. |
| 7,457,906 B2 | 11/2008 | Pettey et al. |
| 7,472,331 B2 | 12/2008 | Kim et al. |
| 7,484,158 B2 | 1/2009 | Sharon et al. |
| 7,529,215 B2 | 5/2009 | Osterling |
| 7,567,472 B2 | 7/2009 | Gatzemeier et al. |
| 7,620,784 B2 | 11/2009 | Panabaker et al. |
| 7,650,480 B2 | 1/2010 | Jiang et al. |
| 7,694,047 B1 | 4/2010 | Alston |
| 7,708,195 B2 | 5/2010 | Yoshida et al. |
| 7,739,472 B2 | 6/2010 | Guterman et al. |
| 7,752,346 B2 | 7/2010 | Talayco et al. |
| 7,801,233 B1 | 9/2010 | Chow et al. |
| 7,860,930 B2 | 12/2010 | Freimuth et al. |
| 7,904,793 B2 | 3/2011 | Mokhlesi et al. |
| 7,930,623 B2 | 4/2011 | Pisek et al. |
| 7,937,641 B2 | 5/2011 | Amidi |
| 7,945,721 B1 | 5/2011 | Johnsen et al. |
| 7,958,430 B1 | 6/2011 | Kolokowsky et al. |
| 7,975,193 B2 | 7/2011 | Johnson |
| 8,094,508 B2 | 1/2012 | Gatzemeier et al. |
| 8,140,930 B1 | 3/2012 | Maru |
| 8,176,367 B2 | 5/2012 | Dreifus et al. |
| 8,219,894 B2 | 7/2012 | Au et al. |
| 8,223,745 B2 | 7/2012 | Johnsen et al. |
| 8,228,728 B1 | 7/2012 | Yang et al. |
| 8,244,946 B2 | 8/2012 | Gupta et al. |
| 8,245,112 B2 | 8/2012 | Hicken et al. |
| 8,245,117 B1 | 8/2012 | Wu |
| 8,250,286 B2 | 8/2012 | Yeh et al. |
| 8,254,112 B2 | 8/2012 | Yang et al. |
| 8,255,770 B2 | 8/2012 | Park et al. |
| 8,259,498 B2 | 9/2012 | Yogev et al. |
| 8,259,506 B1 | 9/2012 | Sommer et al. |
| 8,261,136 B2 | 9/2012 | D'Abreu et al. |
| 8,281,217 B2 | 10/2012 | Kim et al. |
| 8,281,227 B2 | 10/2012 | Inskeep et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 | 12/2012 | Weingarten et al. |
| 8,341,502 B2 | 12/2012 | Steiner et al. |
| 8,351,258 B1 | 1/2013 | Yang et al. |
| 8,359,522 B2 | 1/2013 | Gunnam et al. |
| 8,392,789 B2 | 3/2013 | Biscondi et al. |
| 8,402,201 B2 | 3/2013 | Strasser et al. |
| 8,418,023 B2 | 4/2013 | Gunnam et al. |
| 8,429,325 B1 | 4/2013 | Onufryk et al. |
| 8,429,497 B2 | 4/2013 | Tu et al. |
| 8,473,812 B2 | 6/2013 | Ramamoorthy et al. |
| 8,493,791 B2 | 7/2013 | Karakulak et al. |
| 8,504,885 B2 | 8/2013 | Haratsch et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,638,602 B1* | 1/2014 | Horn ............... G11C 29/021 365/185.03 |
| 8,640,005 B2 | 1/2014 | Wilkerson et al. |
| 8,645,613 B2 | 2/2014 | Tan et al. |
| 8,656,257 B1 | 2/2014 | Micheloni et al. |
| 8,665,648 B2 | 3/2014 | Mun et al. |
| 8,694,849 B1 | 4/2014 | Micheloni et al. |
| 8,694,855 B1 | 4/2014 | Micheloni et al. |
| 8,706,956 B2 | 4/2014 | Cagno et al. |
| 8,707,122 B1 | 4/2014 | Micheloni et al. |
| 8,737,141 B2 | 5/2014 | Melik-Martirosian |
| 8,739,008 B2 | 5/2014 | Liu et al. |
| 8,755,229 B1 | 6/2014 | Visconti et al. |
| 8,762,620 B2 | 6/2014 | Prins et al. |
| 8,769,374 B2 | 7/2014 | Franceschini et al. |
| 8,775,913 B2 | 7/2014 | Haratsch et al. |
| 8,787,428 B2 | 7/2014 | Dai et al. |
| 8,856,622 B2 | 10/2014 | Ramamoorthy et al. |
| 8,898,372 B2 | 11/2014 | Yeh |
| 8,917,734 B1 | 12/2014 | Brown |
| 8,924,824 B1 | 12/2014 | Lu |
| 8,953,373 B1 | 2/2015 | Haratsch et al. |
| 8,958,247 B2 | 2/2015 | Asaoka et al. |
| 8,959,280 B2 | 2/2015 | Ma et al. |
| 8,984,216 B2 | 3/2015 | Fillingim |
| 8,995,197 B1 | 3/2015 | Steiner et al. |
| 8,995,302 B1 | 3/2015 | Brown et al. |
| 9,025,495 B1 | 5/2015 | Onufryk et al. |
| 9,058,289 B2 | 6/2015 | Tai et al. |
| 9,142,314 B2 | 9/2015 | Beltrami et al. |
| 9,164,891 B2 | 10/2015 | Karamcheti et al. |
| 9,244,763 B1 | 1/2016 | Kankani et al. |
| 9,251,909 B1 | 2/2016 | Camp et al. |
| 9,257,182 B2 | 2/2016 | Grunzke |
| 9,268,531 B1 | 2/2016 | Son et al. |
| 9,292,428 B2 | 3/2016 | Kanamori et al. |
| 9,294,132 B1 | 3/2016 | Peleato-Inarrea |
| 9,397,701 B1 | 7/2016 | Micheloni et al. |
| 9,444,655 B2 | 9/2016 | Sverdlov et al. |
| 9,590,656 B2 | 3/2017 | Micheloni et al. |
| 9,842,022 B2* | 12/2017 | Motwani ............... G06F 3/0611 |
| 9,886,214 B2 | 2/2018 | Micheloni et al. |
| 9,916,906 B2 | 3/2018 | Wu et al. |
| 2002/0051501 A1 | 5/2002 | Demjanenko et al. |
| 2002/0129308 A1 | 9/2002 | Kinoshita et al. |

(56) References Cited

U.S. PATENT DOCUMENTS

| | | |
|---|---|---|
| 2002/0181438 A1 | 12/2002 | McGibney |
| 2003/0033567 A1 | 2/2003 | Tamura et al. |
| 2003/0104788 A1 | 6/2003 | Kim |
| 2003/0225970 A1 | 12/2003 | Hashemi |
| 2004/0088636 A1 | 5/2004 | Cypher |
| 2004/0123230 A1 | 6/2004 | Lee et al. |
| 2004/0136236 A1 | 7/2004 | Cohen et al. |
| 2004/0181735 A1 | 9/2004 | Xin |
| 2004/0234150 A1 | 11/2004 | Chang |
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0252791 A1 | 11/2005 | Pechtold et al. |
| 2005/0286511 A1 | 12/2005 | Johnsen et al. |
| 2006/0039370 A1 | 2/2006 | Rosen et al. |
| 2006/0050694 A1 | 3/2006 | Bury et al. |
| 2006/0126728 A1 | 6/2006 | Yu et al. |
| 2006/0206655 A1 | 9/2006 | Chappell et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0101225 A1 | 5/2007 | Moon et al. |
| 2007/0118743 A1 | 5/2007 | Thornton et al. |
| 2007/0136628 A1 | 6/2007 | Doi et al. |
| 2007/0147489 A1 | 6/2007 | Sun et al. |
| 2007/0217253 A1 | 9/2007 | Kim et al. |
| 2007/0233939 A1 | 10/2007 | Kim |
| 2007/0239926 A1 | 10/2007 | Gyl et al. |
| 2008/0005382 A1 | 1/2008 | Mimatsu |
| 2008/0016425 A1 | 1/2008 | Khan et al. |
| 2008/0049869 A1 | 2/2008 | Heinrich et al. |
| 2008/0077843 A1 | 3/2008 | Cho et al. |
| 2008/0148129 A1 | 6/2008 | Moon et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0263265 A1 | 10/2008 | Litsyn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0027991 A1 | 1/2009 | Kaizu et al. |
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar et al. |
| 2009/0307412 A1 | 12/2009 | Yeh et al. |
| 2009/0327802 A1 | 12/2009 | Fukutomi et al. |
| 2010/0085076 A1 | 4/2010 | Danilin et al. |
| 2010/0162075 A1 | 6/2010 | Brannstrom et al. |
| 2010/0185808 A1 | 7/2010 | Yu et al. |
| 2010/0199149 A1* | 8/2010 | Weingarten .......... G06F 11/1068 714/773 |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0262979 A1 | 10/2010 | Borchers et al. |
| 2010/0293440 A1 | 11/2010 | Thatcher et al. |
| 2011/0010602 A1 | 1/2011 | Chung et al. |
| 2011/0055453 A1 | 3/2011 | Bennett et al. |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0161678 A1 | 6/2011 | Niwa |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim et al. |
| 2011/0296084 A1 | 12/2011 | Nango |
| 2011/0307758 A1 | 12/2011 | Fillingim et al. |
| 2012/0008396 A1 | 1/2012 | Park et al. |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0140583 A1 | 6/2012 | Chung et al. |
| 2012/0141139 A1 | 6/2012 | Bakhru et al. |
| 2012/0166690 A1 | 6/2012 | Regula |
| 2012/0167100 A1 | 6/2012 | Li et al. |
| 2012/0179860 A1 | 7/2012 | Falanga et al. |
| 2012/0203986 A1 | 8/2012 | Strasser et al. |
| 2012/0239991 A1 | 9/2012 | Melik-Martirosian et al. |
| 2012/0254515 A1 | 10/2012 | Melik-Martirosian et al. |
| 2012/0311388 A1 | 12/2012 | Cronin et al. |
| 2012/0311402 A1 | 12/2012 | Tseng et al. |
| 2013/0013983 A1 | 1/2013 | Livshitz et al. |
| 2013/0024735 A1 | 1/2013 | Chung et al. |
| 2013/0060994 A1 | 3/2013 | Higgins et al. |
| 2013/0086451 A1 | 4/2013 | Grube et al. |
| 2013/0094286 A1 | 4/2013 | Sridharan et al. |
| 2013/0094290 A1 | 4/2013 | Sridharan et al. |
| 2013/0117616 A1 | 5/2013 | Tai et al. |
| 2013/0117640 A1 | 5/2013 | Tai et al. |
| 2013/0145235 A1 | 6/2013 | Alhussien et al. |
| 2013/0148435 A1* | 6/2013 | Matsunaga ........ G11C 16/3404 365/185.23 |
| 2013/0163327 A1 | 6/2013 | Karakulak et al. |
| 2013/0163328 A1 | 6/2013 | Karakulak et al. |
| 2013/0176779 A1 | 7/2013 | Chen et al. |
| 2013/0185598 A1 | 7/2013 | Haratsch et al. |
| 2013/0198451 A1 | 8/2013 | Hyun et al. |
| 2013/0205085 A1 | 8/2013 | Hyun et al. |
| 2013/0314988 A1 | 11/2013 | Desireddi et al. |
| 2013/0315252 A1 | 11/2013 | Emmadi et al. |
| 2013/0318422 A1 | 11/2013 | Weathers et al. |
| 2014/0029336 A1 | 1/2014 | Venkitachalam et al. |
| 2014/0040704 A1 | 2/2014 | Wu et al. |
| 2014/0053037 A1 | 2/2014 | Wang et al. |
| 2014/0068368 A1 | 3/2014 | Zhang et al. |
| 2014/0068382 A1 | 3/2014 | Desireddi et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0164881 A1 | 6/2014 | Chen et al. |
| 2014/0181426 A1 | 6/2014 | Grunzke et al. |
| 2014/0181617 A1 | 6/2014 | Wu et al. |
| 2014/0185611 A1 | 7/2014 | Lie et al. |
| 2014/0198569 A1 | 7/2014 | Kim et al. |
| 2014/0198581 A1 | 7/2014 | Kim et al. |
| 2014/0215175 A1 | 7/2014 | Kasorla et al. |
| 2014/0219003 A1 | 8/2014 | Ebsen et al. |
| 2014/0229774 A1 | 8/2014 | Melik-Martirosian et al. |
| 2014/0258590 A1* | 9/2014 | Kochar ............... G06F 12/0246 711/103 |
| 2014/0281767 A1 | 9/2014 | Alhussien et al. |
| 2014/0281771 A1 | 9/2014 | Yoon et al. |
| 2014/0281800 A1 | 9/2014 | Micheloni et al. |
| 2014/0281808 A1 | 9/2014 | Lam et al. |
| 2014/0281822 A1 | 9/2014 | Wu et al. |
| 2014/0281823 A1 | 9/2014 | Micheloni et al. |
| 2015/0039952 A1 | 2/2015 | Goessel et al. |
| 2015/0043286 A1 | 2/2015 | Park et al. |
| 2015/0046625 A1 | 2/2015 | Peddle et al. |
| 2015/0127883 A1* | 5/2015 | Chen .................. G11C 11/5642 711/103 |
| 2015/0131373 A1 | 5/2015 | Alhussien et al. |
| 2015/0149871 A1 | 5/2015 | Chen et al. |
| 2015/0169468 A1 | 6/2015 | Camp et al. |
| 2015/0186055 A1* | 7/2015 | Darragh ................ G06F 3/0616 711/103 |
| 2015/0221381 A1 | 8/2015 | Nam |
| 2015/0242268 A1 | 8/2015 | Wu et al. |
| 2015/0332780 A1 | 11/2015 | Kim et al. |
| 2015/0371718 A1 | 12/2015 | Becker et al. |
| 2016/0034206 A1 | 2/2016 | Ryan et al. |
| 2016/0049203 A1 | 2/2016 | Alrod et al. |
| 2016/0071601 A1 | 3/2016 | Shirakawa et al. |
| 2016/0072527 A1 | 3/2016 | Tadokoro et al. |

(56) References Cited

U.S. PATENT DOCUMENTS

| | | |
|---|---|---|
| 2016/0155507 A1 | 6/2016 | Grunzke |
| 2016/0179406 A1 | 6/2016 | Gorobets et al. |
| 2016/0247581 A1 | 8/2016 | Yoshida et al. |
| 2016/0293259 A1 | 10/2016 | Kim et al. |
| 2016/0342494 A1* | 11/2016 | Yang ................ G11C 16/3404 |
| 2016/0365158 A1* | 12/2016 | Yang ................ G11C 29/42 |
| 2017/0147135 A1 | 5/2017 | Higashibeppu |
| 2017/0213597 A1 | 7/2017 | Micheloni et al. |
| 2018/0033490 A1 | 2/2018 | Marelli et al. |

OTHER PUBLICATIONS

NVM Express, Revision 1.0; Intel Corporation, Mar. 1, 2011, pp. 1-122.

RapidIO, PCI Express, and Gigabit Ethernet Comparison: Pros and Cons of Using Three Interconnects in Embedded Systems; RapidIO Trade Association, Technical White Paper, Revision 03,, May 2005, 1-36.

PCI Express Base Specification Revision 3.0 (PCI Express Base Expression, PCISIG, hereinafter "PCIExpress"), Nov. 10, 2010, 1-860.

RFC 793: Transmission Control Protocol, RFC 793, University of Southern California, IETF,, Sep. 1981, pp. 1-89.

Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.

Chen, et al., "Increasing flash memory lifetime by dynamic voltage allocation for constant mutual information", 2014 Information Theory and Applications Workshop (ITA), 2014, pp. 1-5.

Peleato, et al., "Probabilistic graphical model for flash memory programming", Statistical Signal Processing Workshop (SSP), 2012 IEEE, 2012, pp. 1-4.

Wu, et al., "Reducing SSD Read Latency via NAND Flash Program and Erase Suspension", Proceedings of FAST'2012; Department of Electrical and Computer Engineering Virginia Commonwealth University, Richmond, VA 23284, 2012, pp. 117-123.

International Search Report and Written Opinion of the International Searching Authority dated Oct. 23, 2017 International application No. PCTAJS2017/044037.

International Search Report and Written Opinion of the International Searching Authority dated Jun. 10, 2017, International application No. PCT/US2017/043799.

\* cited by examiner

NONVOLATILE MEMORY SYSTEM WITH BACKGROUND REFERENCE POSITIONING AND LOCAL REFERENCE POSITIONING

BACKGROUND

Solid state drive (SSD) devices commonly employ NAND flash memory chips and a flash controller to manage the flash memory and to transfer data between the flash memory and a host computer. Uncorrectable Bit Error Rates (UBER) requirements for client and enterprise Solid State Drives (SSD's) are very stringent, requiring UBER of $10^{-15}$ for client SSD's and $10^{-16}$ for enterprise SSD's. Error correction codes have been widely adopted to obtain the low Bit Error Rate (BER) required to achieve these low UBER requirements. Driven by cost, the NAND industry keeps pushing hard on process technology shrink. Technology shrink has been successful in increasing the number of Gbit per mm$^2$, but this success has resulted in increased BER of NAND flash memory chips and SSD's that use NAND flash memory chips.

Standard read operations are performed over the lifetime of the SSD. However, as the NAND devices in the SSD age and are subjected to numerous read, program and erase (P/E) cycles, the BER increases, ultimately resulting in decode failures in which the decoding process is unsuccessful in recovering the stored codeword. Conventional flash management techniques have extended the lifetime of SSD's by performing a read retry immediately after a failed standard read operation, allowing the SSD to recover the codeword that was not recovered in the original read operation. However, the price that is paid for this extension of the SSD's life is increased read latency. When read retry is triggered as a result of a decode failure, the latency of the SSD is increased by the time required to perform the standard read operation plus the time required for the read retry operation. This presents a problem. Accordingly, there is a need for a method and apparatus that will reduce read latency and that will meet stringent UBER requirements.

SUMMARY

A nonvolatile memory system is disclosed that includes a status circuit configured to determine at least one usage characteristic of a nonvolatile memory device. A background reference positioning circuit is coupled to the status circuit and is configured to perform, upon the occurrence of one or more of an endurance event, a retention timer event and a read disturb event at a closed block, background reads of representative pages of each page group of the closed block at offsets to each threshold voltage that is required for reading the representative pages of each page group of the closed block to identify a set of updated threshold voltage offset values for each page group of the closed block. A read circuit is coupled to the status circuit and to the background reference positioning circuit. The read circuit is configured to determine whether a determined usage characteristic meets a usage characteristic threshold. When the usage characteristic is determined to meet the usage characteristic threshold, the read circuit is configured to perform subsequent host-requested reads of the nonvolatile memory device using a threshold voltage shift read instruction, and wherein subsequent host-requested reads of pages of the closed block are performed using the set of updated threshold voltage offset values corresponding to the page group of the page being read.

A method for reducing latency of a nonvolatile memory controller is disclosed that includes identifying a plurality of page groups in each block of a nonvolatile memory device. After a block of the nonvolatile memory device is closed, and upon the occurrence of one or more of an endurance event, a retention timer event and a read disturb event at the closed block, background reads of representative pages of each page group of the closed block are performed at offsets to each threshold voltage that is required for reading the representative pages of each page group of the closed block to identify a set of updated threshold voltage offset values for each page group of the closed block. The method further includes determining whether a usage characteristic of the nonvolatile memory device meets a usage characteristic threshold and when a usage characteristic is determined to meet the usage characteristic threshold, performing subsequent host-requested reads of pages of the closed block using a threshold voltage shift read instruction and using the set of updated threshold voltage offset values corresponding to the page group of the page being read.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
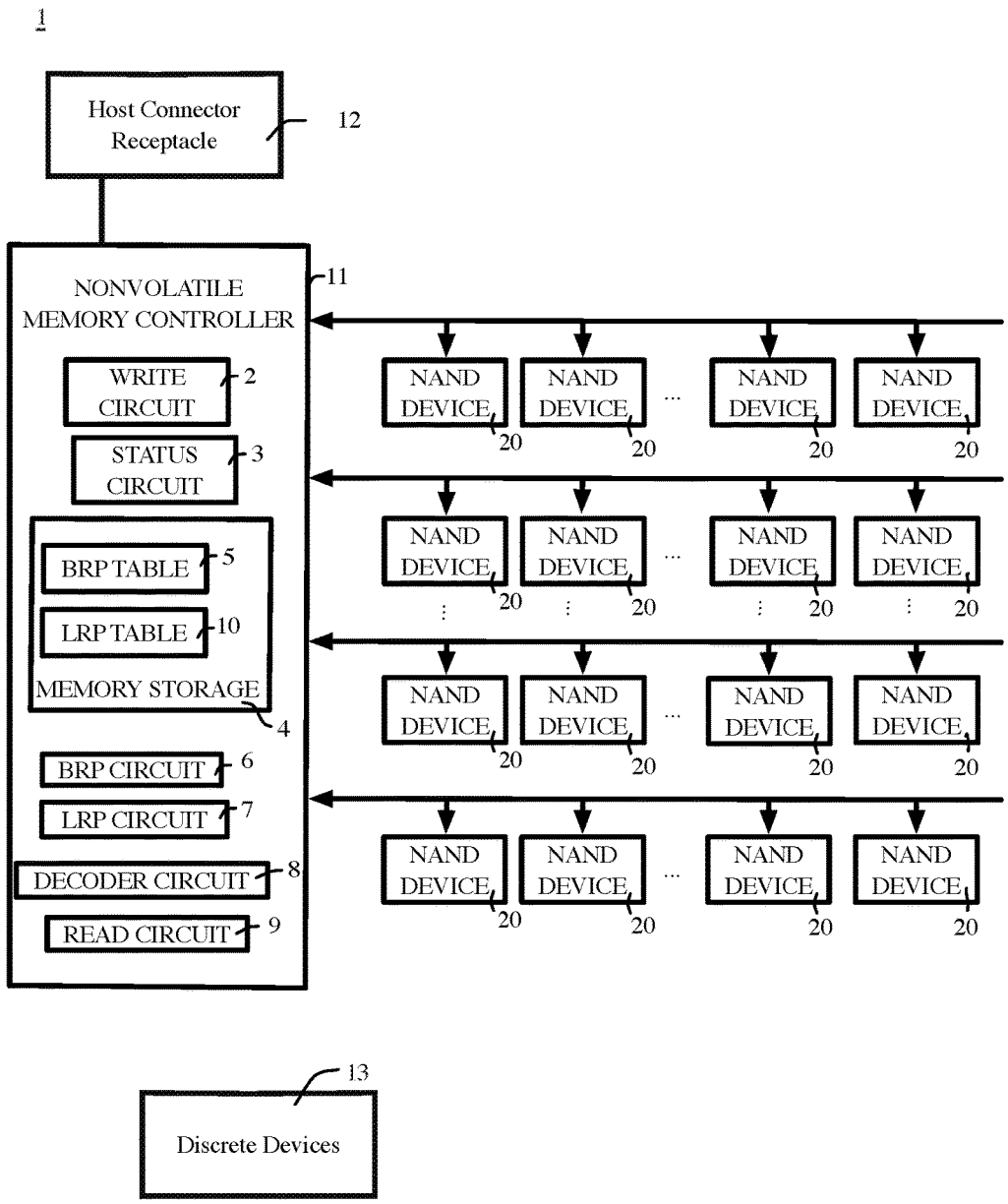
FIG. 1 is a block diagram illustrating a nonvolatile memory system in accordance with an embodiment of the present invention.

A nonvolatile memory system 1 is shown in FIG. 1 to include a nonvolatile memory controller 11 coupled to a plurality of nonvolatile memory devices 20 for storing data. In the present embodiment the nonvolatile memory devices 20 are NAND devices and nonvolatile memory system 1 is a solid state drive (SSD) that includes one or more circuit boards onto which host connector receptacle 12, nonvolatile memory controller 11 and nonvolatile memory devices 20 are attached. Nonvolatile memory system 1 may also include one or more discrete device 13 attached to the circuit board and to one or more of host connector receptacle 12, nonvolatile memory controller 11 and nonvolatile memory devices 20.

Nonvolatile memory controller 11 is configured to receive read and write instructions from a host computer through host connector receptacle 12 of FIG. 1, and to perform program operations, erase operations and read operations on memory cells of nonvolatile memory devices 20 to complete the instructions from the host computer. For example, upon receiving a write instruction from the host computer via host connector receptacle 12, memory controller 11 is operable to store data into nonvolatile memory system 1 by performing program operations (and when required, erase operations) on one or more nonvolatile memory device 20, and upon receiving a read instruction nonvolatile memory controller 11 is operable to read data from nonvolatile memory system 1 by performing host-requested read operations on one or more nonvolatile memory device 20. The term "host-requested read," as used in the present application includes only those reads that are performed in response to an instruction received from an external device (e.g., received at host connector receptacle 12), and specifically includes read requests received from a host computer or other external computing device. Host-requested reads do not include background reads performed during a background reference positioning operation, or reads performed pursuant to housekeeping operations such as garbage collection, wear leveling and block recycling, without limitation.

Figure 2:
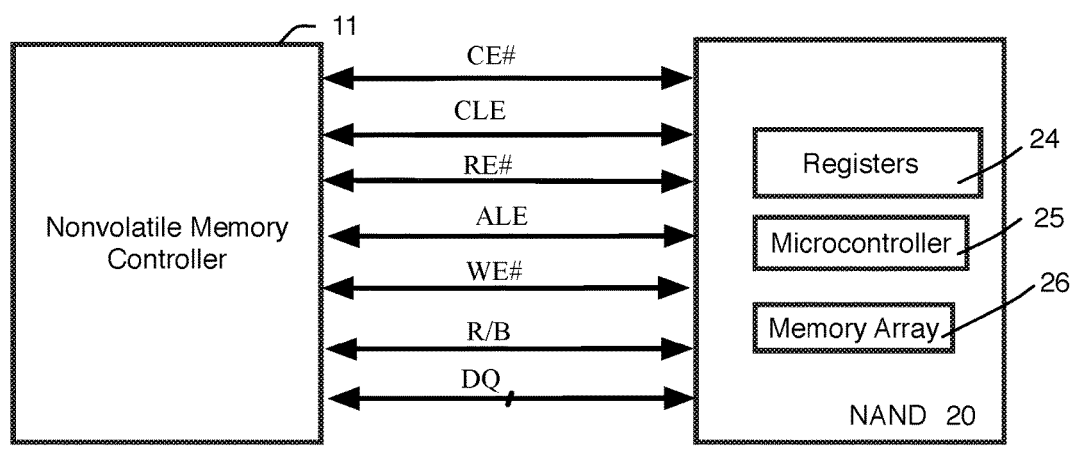
FIG. 2 is a diagram illustrating a nonvolatile memory controller and a nonvolatile memory device and illustrates the communication between the nonvolatile memory controller and the nonvolatile memory device in accordance with an embodiment of the present invention.

In the present embodiment each nonvolatile memory device 20 is a packaged semiconductor die or "chip" that is coupled to nonvolatile memory controller 11 by conductive pathways that couple instructions, data and other information between each nonvolatile memory device 20 and nonvolatile memory controller 11. In the embodiment shown in FIG. 2 each nonvolatile memory device 20 includes registers 24, microcontroller 25 and memory array 26, and is coupled to nonvolatile memory controller 11 by a chip enable signal line (CE#), a command latch enable (CLE) signal line, a read enable signal line (RE#), an address latch enable (ALE) signal line, a write enable signal line (WE#), a read/busy (R/B) signal line and input and output (DQ) signal lines. Upon receiving a write instruction from the host computer, write circuit 2 is operable to encode received data into a codeword that is sent to registers 24 along with a corresponding NAND write instruction. Microcontroller 25 is operable to perform the requested NAND write instruction and store the codeword into memory array 26 by programming cells of memory array 26. In response to receiving a read instruction from the host computer, read circuit 9 is operable to send a read instruction to NAND 20 that is stored in registers 24. Microcontroller 25 reads the codeword from memory array 26 in response to the read instruction and outputs the codeword at registers 24. The codeword is sent to decoder 8 that is operable to decode the codeword to obtain the stored data.

Figure 3:
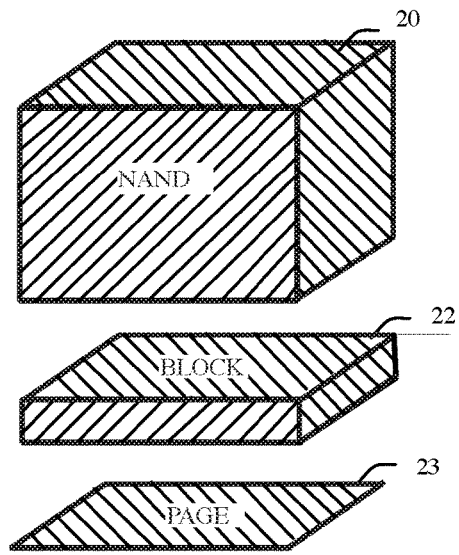
FIG. 3 is block diagram illustrating a memory logic organization in accordance with an embodiment of the present invention.

Referring now to FIG. 3, each nonvolatile memory device 20 includes NAND memory cells that are organized into blocks 22 and pages 23, with each block 22 composed of NAND strings that share the same group of word lines. Each logical page 23 is composed of cells belonging to the same word line. The number of logical pages 23 within logical block 22 is typically a multiple of 16 (e.g. 64, 128). In the present embodiment, a logical page 23 is the smallest addressable unit for reading from and writing to the NAND memory and a logical block 22 is the smallest erasable unit. However, it is appreciated that in embodiments of the present invention programming to less than an entire page may be possible, depending on the structure of the NAND array.

Figure 4:
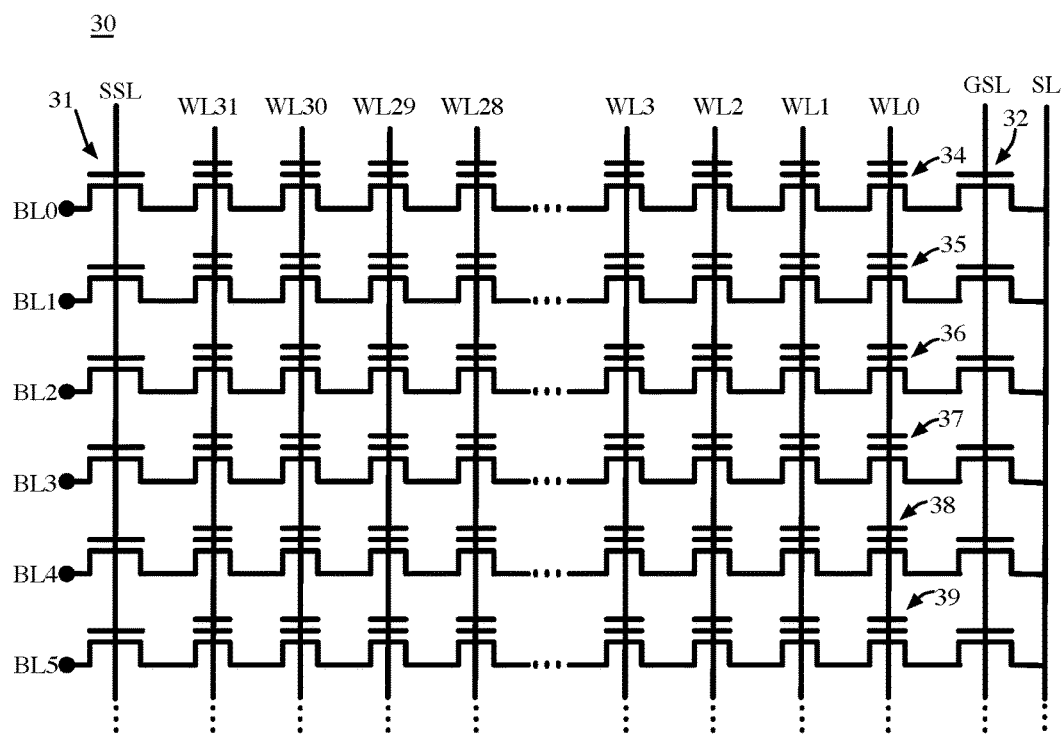
FIG. 4 is a diagram illustrating a NAND array in accordance with an embodiment of the present invention.

An exemplary memory array 30 is shown in FIG. 4 that is made of NAND memory cells connected in series to form NAND strings. Each NAND string is isolated from the rest of the array by select transistors, such as, for example, select transistor 31 and select transistor 32. Multiple memory cells share the gate voltage (Vg) through a word line, and the drain of one memory cell is the source of the adjacent one. For example, memory cells 34-39 of FIG. 3 share word line 0 (WL0). Memory cells 34-39 may be single level cells that each store a single bit of information or NAND devices that store 2 bits per cell, 3 bits per cell or 4 bits per cell. The structure of the NAND array may be planar or 3D.

In the embodiment shown in FIG. 1 nonvolatile memory controller 11 includes a read circuit 9 that is configured to perform reads of the nonvolatile memory device 20 using both a conventional read instruction and a threshold voltage shift read instruction. Normal reads are reads performed using a "hard read instruction" (e.g., READ instruction) where a single read is performed at each threshold voltage required to define a bit of the memory cell. Threshold voltage shift reads and soft reads are not considered to be normal reads. In response to a soft read instruction, the NAND device 20 generates a codeword plus soft information that indicates the read results from the read of the threshold voltage and offset threshold voltages.

Threshold voltage shift reads are performed by sending a threshold voltage shift read instruction to a NAND device 20 that includes one or more threshold voltage offset value that is to be used by the NAND device 20 in performing the read. Threshold voltage offset values, that may also be referred to hereinafter as simply "offset values" or "offsets" indicate the amount by which the threshold voltage that is used to perform the read is to be offset from a corresponding default threshold voltage and are specified by the manufacturer of the NAND device 20. In the present embodiment NAND devices 20 will perform threshold voltage shift reads using offset values of −2, −1, 0, +1 and +2. For MLC NAND devices and TLC NAND devices, reads are required at more than one threshold voltage to identify the value of a particular bit. Therefore, threshold voltage shift read instructions for MLC NAND or TLC NAND devices 20 will include two or more threshold voltage offset values, one threshold voltage offset value for each voltage position required to identify the particular bit being read. In response to receiving a threshold voltage shift read instruction that includes the required threshold voltage offset values, NAND device 20 is operable to perform reads at threshold voltages corresponding to the indicated threshold voltage offset values to generate a codeword that indicates the read results.

An erased block of a NAND 20 may be referred to as a "free block." When data is programmed into a block the block is referred to as an "open block" until all pages of the block have been programmed. Once all pages of the block have been programmed the block is referred to as a "closed block" until it is erased.

Nonvolatile memory controller 11 includes write circuit 2, memory storage 4, a status circuit 3 that is coupled to a read circuit 9, a background reference positioning (BRP) circuit 6 that is coupled to status circuit 3 and to read circuit 9, a decoder circuit 8 that is coupled to read circuit 9 and a local reference positioning (LRP) circuit 7. Memory storage 4 is configured to store data indicating threshold voltage shift read parameters and corresponding index values. In one embodiment data indicating threshold voltage shift read parameters and corresponding index values are stored in memory storage 4 on nonvolatile memory controller 11. Alternatively, the data indicating threshold voltage shift read parameters and corresponding index values can be stored in one or more nonvolatile memory devices 20 or in a separate discrete device 13 that may be, for example a DRAM. In the present embodiment the threshold voltage shift read parameters are stored in one or more tables shown as background reference positioning (BRP) table 5.

Status circuit 3 is configured to determine usage characteristics of nonvolatile memory devices 20. The determined usage characteristics may be stored in memory storage 4 of nonvolatile memory controller 11. Alternatively, the determined usage characteristics can be stored in one or more nonvolatile memory devices 20 or in a separate discrete device 13 that may be, for example a DRAM. The term "usage characteristic" as used in the present invention is a value determined during usage of a nonvolatile memory device that indicates the historical usage of the nonvolatile memory device up to a particular point in time which may be, without limitation, the number of program and erase cycles or the bit error rate (BER) of a block or a group of blocks of a nonvolatile memory device 20.

Figure 5:
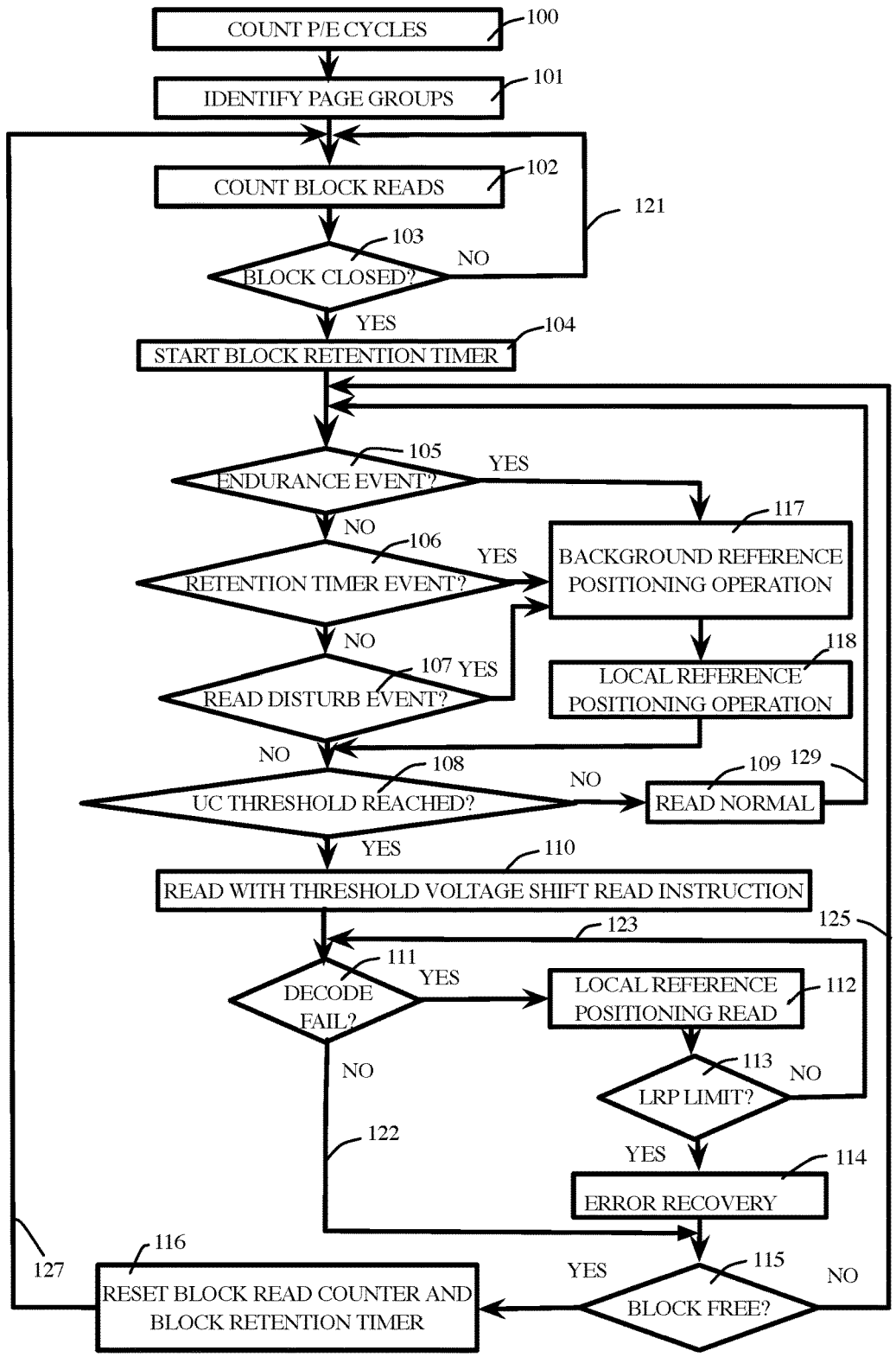
FIG. 5 is a flow diagram illustrating a method for reducing latency of reads of nonvolatile memory devices coupled to a memory controller in accordance with an embodiment of the present invention.

FIG. 5 illustrates a method for reducing latency of a nonvolatile memory controller that includes counting the number of program and erase cycles, as shown in step 100. In the present embodiment status circuit 3 is operable for counting the number of program and erase (P/E) cycles of each block of each NAND device 20. The method further includes identifying a plurality of page groups in each block of a nonvolatile memory device, as shown in step 101. In the present embodiment each block 22 of each nonvolatile memory device 20 is divided into page groups that include pages having similar error characteristics.

Wordlines are grouped into topological groups (upper pages, middle pages and lower pages) and in categories according to their topological shifting behavior. In the present embodiment topological shifting behavior is categorized by assigning different wordlines to different categories. In one illustrative embodiment wordlines are grouped into the following categories:

First: wordline 0 to wordline 24.
Second: wordline 25 to wordline 84.
Third: wordline 85 to wordline 119.
Fourth: wordline 120 to wordline 127.

It can be seen that different wordline groups do not necessarily include the same number of wordlines or the same number of memory cells. In the present embodiment wordline groups are determined by analyzing the characteristics of NAND devices in a lab to identify groupings that have similar error behavior. In the present illustrative embodiment nonvolatile memory devices 20 are TLC NAND devices in which each memory cell can store three different bits of information. Since there are three page types in a TLC NAND device, this gives the following page groups:

Page Group 1: upper pages of wordlines 0-24.
Page Group 2: middle pages of wordlines 0-24.
Page Group 3: lower pages of wordlines 0-24.
Page Group 4: upper pages of wordlines 25-84.
Page Group 5: middle pages of wordlines 25-84.
Page Group 6: lower pages of wordlines 25-84.
Page Group 7: upper pages of wordlines 85-119.
Page Group 8: middle pages of wordlines 85-119.
Page Group 9: lower pages of wordlines 85-119.
Page Group 10: upper pages of wordlines 120-127.
Page Group 11: middle pages of wordlines 120-127.
Page Group 12: lower pages of wordlines 120-127.

Accordingly, in an embodiment in which nonvolatile memory device system 1 includes 128 nonvolatile memory devices, and 2048 blocks per nonvolatile memory device, system 1 will include 3,145,728 (128×2048×12) page groups.

In one embodiment, in addition to grouping pages, blocks are grouped to reduce the number of page groups that need to be managed. In one exemplary embodiment the blocks of each nonvolatile memory device are divided into 32 block groups that may correspond to channels of nonvolatile memory system 1, reducing the number of page groups of each nonvolatile memory device 20 to 768 and reducing the number of page groups in nonvolatile memory system 1 to 98,304.

The number of reads of each block of each nonvolatile memory device 20 is counted 102. In the embodiment shown in FIG. 1 status circuit 3 is operable to determine the number of reads for each block (BLOCK READ COUNT) and store the number of reads for each block in memory storage 4. In the present embodiment the number of reads for each block is incremented each time that a page of the block is read, both while the block is open 102-103 and while it is closed, and the block read counter is not reset 116 until the block is erased 115-116.

In one embodiment when blocks are open the time that the block is open is determined and the block is closed if the block open time exceeds a predetermined threshold (e.g. 1 hour) to make sure that blocks do not stay open too long. The block may be closed by programming all unprogrammed pages of the open block with dummy data. Also, in embodiments of the present invention, if the block read count exceeds a predetermined open-block read count threshold (e.g., 150,000 reads) the block is sent to reclamation and is copied and erased to prevent read errors in the open block.

When a block is closed 103 a block retention timer is started 104. In the embodiment shown in FIG. 1 status circuit 3 includes a block retention timer that starts timing when each block 22 of each nonvolatile memory device 20 is closed. The block retention time for each block 22 indicates the time that each closed block has remained closed and will not stop or be reset until the block becomes free 115-116, 127 such as when the block is erased.

Upon the occurrence one or more of an endurance event 105, a retention timer event 106 and a read disturb event 107 at the closed block, a background reference positioning operation is performed 117. In the embodiment shown in FIG. 1 BRP circuit 6 is configured to determine when an endurance event has occurred, when a retention timer event has occurred and when a read disturb event has occurred at a closed block of one of nonvolatile memory devices 20.

In one embodiment step 105 is performed by determining whether the block P/E count exceeds an endurance threshold and step 106 is performed by determining whether the block retention time exceeds a retention time threshold and step 107 is performed by determining whether the block read count exceeds a block read threshold. In one embodiment the endurance threshold, the retention time threshold and the block read threshold are user programmable so that they may be changed to accommodate the characteristics of different types of NAND devices 20.

BRP circuit 6 is operable to perform background reference positioning operations 117 by performing background reads of representative pages of each page group of the closed block at offsets to each threshold voltage that is required for reading the representative pages of each page group of the closed block to identify a set of updated threshold voltage offset values for each page group of the closed block. Background reference positioning operations 117 continue to be performed on endurance, retention timer and read disturb events as long as a block is closed as shown by line 125. When the block becomes free 115-116, such as when the block is erased, background reference positioning operations 117 and local reference positioning operations 118 are no longer performed as shown by line 121 until the block is again closed 103.

In embodiments of the present invention BRP circuit 6 is operable to perform background reads by sending read instructions to read circuit 9. Read circuit 9 is operable upon receiving the instructions to perform reads by assigning a lower priority to background read instructions performed in step 117 than the priority assigned to read instructions generated in response to read requests from a host computing device. In another embodiment read circuit 9 is operable to assign priority values to read instructions including a high priority value, a medium priority value and a low priority value and is operable to assign a high priority value to read instructions generated in response to read requests from a host computing device, and is further operable to prioritize between background read instructions performed in step 117 and read instructions for housekeeping operations by assigning either the medium priority value or the low priority value to a particular read instruction.

Figure 6:
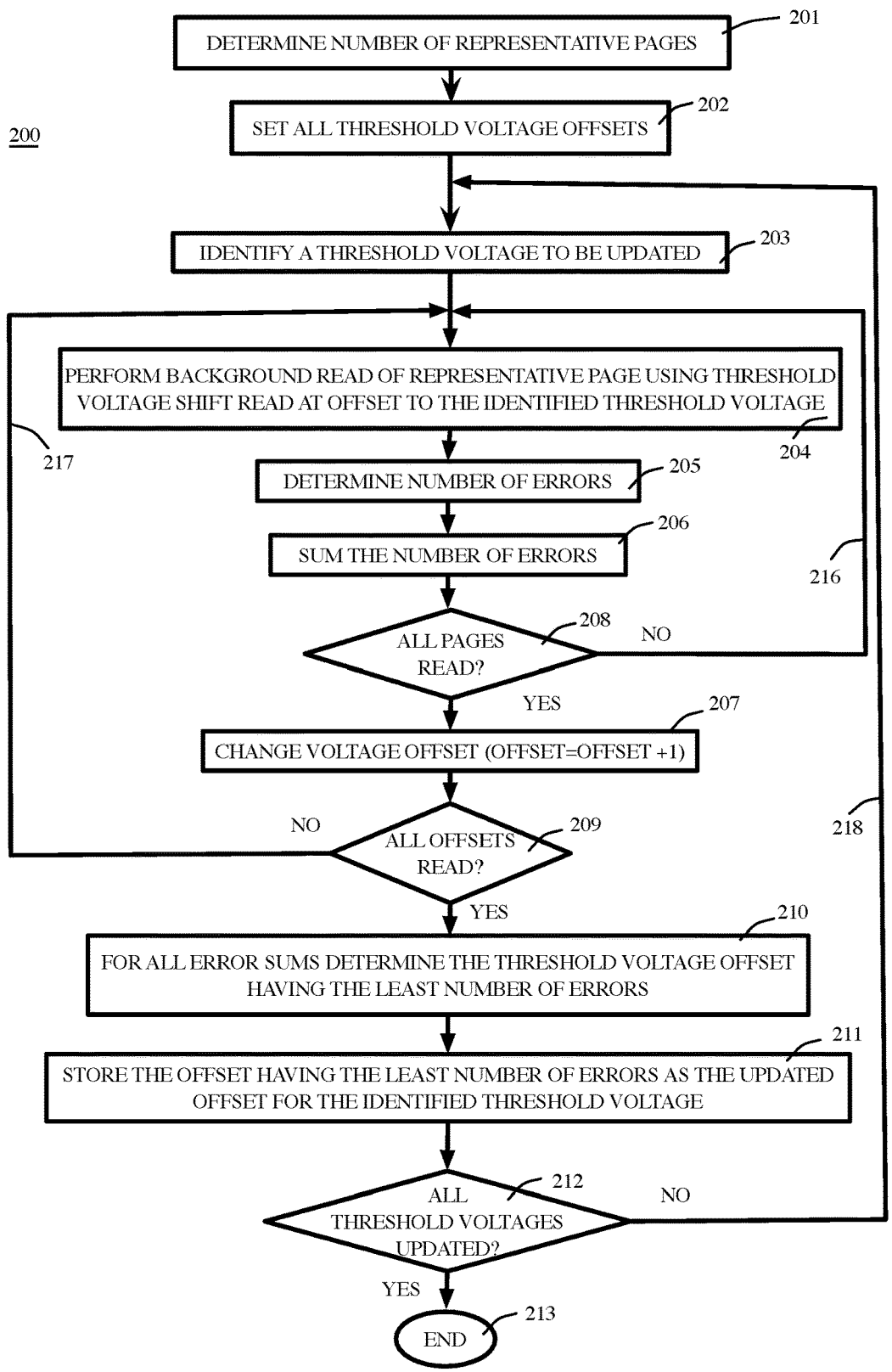
FIG. 6 is a flow diagram illustrating steps for performing a background reference positioning operation in accordance with an embodiment of the present invention.

FIG. 6 illustrates an exemplary background reference positioning operation 200 in accordance with an embodiment of the present invention. The number of representative pages to be used in each background read step is determined 201. The greater the number of pages tested, the greater the accuracy. However, more pages means each background reference positioning operation takes more time. In the present embodiment five representative pages are chosen from each page group. In the present embodiment, since each logical page is a wordline, that means that five representative wordlines will be read from each page group. More particularly, background reference positioning testing will be performed on 60 exemplary pages (4×3×5) of each tested block.

Offsets to threshold voltages required to read the representative pages are set 202 to the offset determined in a previous background reference partitioning operation. If no previous background reference partitioning operation has been performed, all threshold voltage offsets are set to zero. One of the threshold voltages required to read the representative pages is then identified to be updated 203. A background read of a representative page is performed 204 using a threshold voltage shift read instruction at an offset to the identified threshold voltage. In one embodiment BRP circuit 6 is operable to perform steps 201-203 and is operable to perform step 204 by sending a background read instruction to read circuit 9 that is operable to send a threshold voltage shift read instruction to the NAND device 20 being read.

The number of errors in the read of step 204 is determined 205 and the determined number of errors is summed 206. In the present embodiment the results of each read operation are received at read circuit 9 and are sent to decoder 8 that is operable to decode the read results and determine the number of errors found in the decode operation.

This process is repeated for all representative pages 208, 216 and offset values are changed 207 and the process is continued 209, 217 until all representative pages have been read at all offsets values for the threshold voltage identified in step 203 (with other threshold voltage offsets remaining at the values determined in step 202 until selected in step 203). After the representative pages have been read at all offset values the threshold voltage offset producing the least number of errors is determined 210. In one embodiment step 210 includes determining the error sum from the summing of errors from each read at an offset voltage 206 and identifying the threshold voltage offset corresponding to the error sum determined to have the least number of errors. The updated threshold voltage offset is stored 211 as the updated threshold voltage offset value for the identified threshold voltage. After the threshold voltage offset values have been updated for a selected threshold voltage the process is repeated 218 at different identified threshold voltages 203 and using the updated threshold voltage offset stored in step 211 (instead of the corresponding threshold voltage offset from step 202) in subsequent reads 204 of the background reference partitioning operation 200, until all threshold voltages have been updated 212 and the process ends 213. In the present embodiment BRP circuit 6 is operable to perform steps 207-212.

Figure 7:
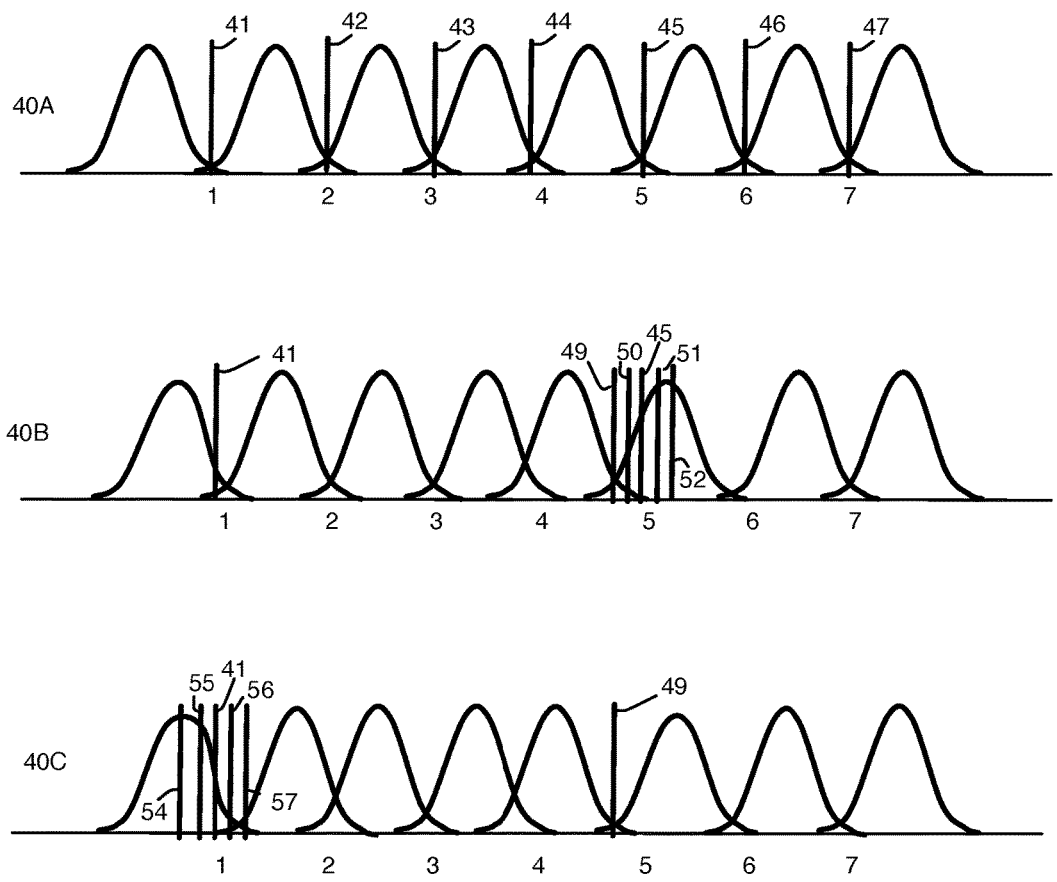
FIG. 7 is a diagram showing threshold voltage distributions for a TLC NAND device and illustrating an exemplary background reference positioning operation performed on a lower page of a triple level cell nonvolatile memory device in accordance with an embodiment of the present invention.

FIG. 7 illustrates performing an exemplary background reference partitioning operation 200 for exemplary triple level cell NAND devices 20 that define bits by reads at threshold voltage regions 1-7 to identify voltage distributions 40A using default threshold voltages 41-47. More particularly, when a threshold voltage shift read instruction with an offset of 0 is received at a NAND device 20, two or more of default threshold voltages 41-47 will be used to read the stored codeword. In the present embodiment lower page threshold voltages are read at threshold voltage regions 1 and 5 (default threshold voltages 41 and 45), upper page bits are defined by reads at threshold voltage regions 3 and 7 (default threshold voltages 43 and 47), and middle page bits are defined by reads at threshold voltage regions 2, 4 and 6 (default threshold voltages 42, 44 and 46). In this exemplary embodiment, NAND devices 20 are capable of performing threshold voltage shift reads at threshold voltage offset values of −2, −1, 0, +1 and +2.

In the present example the page group that is being read in step 204, which is identified as exemplary page group 501, is a lower-page page group consisting of only lower pages. Accordingly, the set of threshold voltages that will be required to read each of the pages in the background read 204 will be lower page threshold voltages in regions 1 and 5. Therefore, each threshold voltage shift read instruction for a lower page will include two threshold voltage offsets, and the threshold voltage shift read instruction may be represented as $BRP_{READ}(V_{O1}, V_{O5})$, where "$V_{O1}$" is the threshold voltage offset for reading region 1 and "$V_{O5}$" is the threshold voltage offset for reading region 5.

In the present exemplary embodiment the threshold voltage offset for region 1 and the threshold voltage offset for region 5 are both set at 0 in step 202 based on updated threshold voltage offsets calculated in a previous background reference partitioning operation 200. Threshold voltage 45 of region 5 is selected first for updating in step 203. In the example 40B shown in FIG. 7, in step 204 a first background read ($BRP_{READ}(0, -2)$) is performed at an offset of 0 for region 1 and an offset of −2 for region 5, shown as reference voltages 41, 49, to define a first codeword that is decoded to determine the number of errors in the read of the page 205 and the number of errors in the read is summed 206 to obtain a voltage offset error sum $S_{V5-1}$. A background read of a second page $BRP_{READ}$ (0, −2) is performed 204 to define a second codeword that is decoded to determine the number of errors in the read of the page as shown in step 205 and the number of errors is summed 206 to obtain a voltage offset error sum $S_{V5-1}$. A background read of a third page $BRP_{READ}$ (0, −2) is performed 204 to define a third codeword that is decoded to determine the number of errors in the read of the page as shown in step 205 and the number of errors is summed 206 to obtain a voltage offset error sum $S_{V5-1}$. A background read of a fourth page $BRP_{READ}$ (0, −2) is performed to define a fourth codeword that is decoded to determine the number of errors in the read of the page as shown in step 205 and the number of errors is summed 206 to obtain a voltage offset error sum $S_{V5-1}$. A background read of a fifth page $BRP_{READ}$ (0, −2) is performed to define a fifth codeword that is decoded to determine the number of errors in the read of the page as shown in step 205 and the number of errors is summed 206 to obtain the final voltage offset error sum $S_{V5-1}$ that is the sum of all of the errors in the first codeword, the second codeword, the third codeword, the fourth codeword and the fifth codeword. Once all pages have been read 208, 216 the voltage offset is changed 207 by adding one to the voltage offset value used in the previous background read 204 and steps 203-206 are repeated using the voltage offset of the previous step 207 until all pages have been read 208, 216 at all offsets 209, 217. In exemplary embodiment 40B, steps 204-207 are repeated for all of the other offsets for voltage region 5, while maintaining the offset in the first voltage region at 0. More particularly, the five exemplary pages are read 204 at $BRP_{READ}$ (0, −1), shown as threshold voltages 41, 50 to calculate 206 a second voltage offset error sum $S_{V5-2}$. At the next iteration the offset for region 5 is changed to 0 and the five exemplary pages are read 204 at $BRP_{READ}$ (0, 0), shown as threshold voltages 41, 45 to calculate 206 a third voltage offset error sum $S_{V5-3}$. At the next iteration the offset for region 5 is changed to +1 in step 207 and the five exemplary pages are read at $BRP_{READ}$ (0, +1), shown as threshold voltages 41, 51, to calculate 206 a fourth voltage offset error sum $S_{V5-4}$. At the next iteration the offset for region 5 is changed to +2 in step 207 and the five exemplary pages are read at $BRP_{READ}$ (0, +2), shown as threshold voltages 41, 52 to calculate 206 a fifth voltage offset error sum $S_{V5-5}$. In step 210 the threshold voltage offset having the least number of errors is determined, which will be the least of the error sums $S_{V5-1}$, $S_{V5-2}$, $S_{V5-3}$, $S_{V5-4}$ and $S_{V5-5}$. In the present example, the first voltage offset error sum $S_{V5-1}$ is determined to have the least number of errors which corresponds to a threshold voltage offset value of −2 that is stored 211 (e.g., ($V_{BRP5}$=−2)) as a first one of the updated threshold voltage offset values for the page group. In one embodiment the updated threshold voltage offset value is stored by overwriting the corresponding threshold voltage offset value set in step 202.

Threshold voltage 41 of region 1 is identified next to be updated 203 and reads are performed at different offsets in region 1 until all five pages have been read at all possible offsets as shown by lines 216-217 while maintaining the threshold voltage offsets to all other regions at the updated threshold offset from step 211 or at the value set in step 202 if the particular threshold voltage has not yet been selected 203 for updating. In the example 40C shown in FIG. 7, steps 204-207 perform background reads at offsets 41 and 54-57 while maintaining the offset of region 5 at −2 (threshold voltage 49). More particularly, referring now to 40C, five exemplary pages are read 204 at $BRP_{READ}$ (−2, −2), shown as threshold voltages 54, 49, to calculate 206 a first voltage offset error sum $S_{V1-1}$; five exemplary pages are read 204 at $BRP_{READ}$ (−1, −2), shown as threshold voltages 55, 49, to calculate 206 a second voltage offset error sum $S_{V1-2}$; five exemplary pages are read 204 at $BRP_{READ}$ (0, −2), shown as threshold voltages 41, 49, to calculate 206 a third voltage offset error sum $S_{V1-3}$; and five exemplary pages are read at $BRP_{READ}$ (+1, −2), shown as threshold voltages 56, 49, to calculate 206 a fourth voltage offset error sum $S_{V1-4}$. At the next iteration the offset for region 1 is changed to +2 in step 207 and the five exemplary pages are read at $BRP_{READ}$ (+2, −2), shown as threshold voltages 57, 49, to calculate 206 a fifth voltage offset error sum $S_{V1-5}$. In step 210 the threshold voltage offset having the least number of errors is determined, which will be the least of the error sums $S_{V1-1}$, $S_{V1-2}$, $S_{V1-3}$, $S_{V1-4}$ and $S_{V1-5}$. In the present example, the fifth voltage offset error sum $S_{V1-5}$ is determined to have the least number of errors (e.g., the minimum value) so the threshold voltage offset value corresponding to $S_{V1-5}$ is stored 211 (e.g., ($V_{BRP1}$=+2)) as a second one of the updated threshold voltage offset values for the page group. Since the lower page includes only two reference voltages in the present example, all reference voltages have been tested 213. In one embodiment the result of the calibration process of steps 201-214 is stored in BRP table 5 as the set of updated reference voltage offset values for the tested page group. In the present embodiment the results are concatenated and are stored in the threshold voltage shift parameters for the page group as the most recent determined set of updated threshold voltage offsets for the page group and may be represented in the form $VBRP_{501}=(V_{BRP1}, V_{BRP5})$ which in this example has the value $VBRP_{501}=(+2, −2)$).

In the event that data from read 204 is uncorrectable or the determined number of errors 205 exceeds a specific threshold, the closed block may be marked as a "weak block" and the retention time threshold is halved, the endurance threshold is halved and the block read threshold is halved for subsequent steps 105-107 on the weak block. Alternatively, the closed block may be marked as a bad block.

In one embodiment each time that an updated threshold voltage offset value is determined based on the occurrence of an endurance event it is stored as $VBRP_{ENDURANCE}$ for the page group (which represents the most recently determined endurance threshold voltage offset value for the page group) in BRP table 5. Each time that an updated threshold voltage offset value is determined based on the occurrence of a retention timer event, or a read disturb event, the updated threshold voltage offset value is stored as $VBRP_{RET\_RD}$ for the page group. The threshold voltage offset value stored as $VBRP_{RET\_RD}$ for the page group thus represents the most recently determined updated threshold voltage offset value for the page group, and may be from an endurance event, a retention timer event or a read disturb event, and is a temporary voltage threshold offset value that takes into account the changes to the threshold voltage while the block is closed. When the next endurance event occurs, the calculated VBRP for the page group is stored as $VBRP_{ENDURANCE}$ (e.g., by overwriting the previous $VBRP_{ENDURANCE}$ value). Each time that $VBRP_{ENDURANCE}$ is calculated, it is also stored as $VBRP_{RET\_RD}$ for the page group (e.g., by overwriting the previous $VBRP_{RET\_RD}$ value). Each time that an updated threshold voltage offset is determined based on the occurrence of a retention timer event or a read disturb event it is stored as $VBRP_{RET\_RD}$ for the page group (e.g., by overwriting the previous $VBRP_{RET\_RD}$ value).

Figure 8:
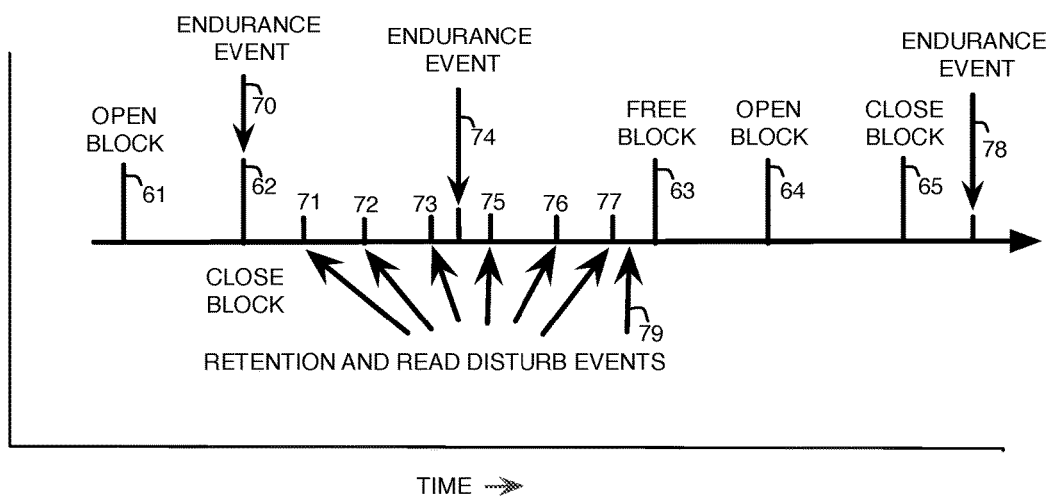
FIG. 8 is a diagram illustrating exemplary endurance events, retention timer events and read disturb events with time shown in the horizontal axis in accordance with an embodiment of the invention.
Figure 9:
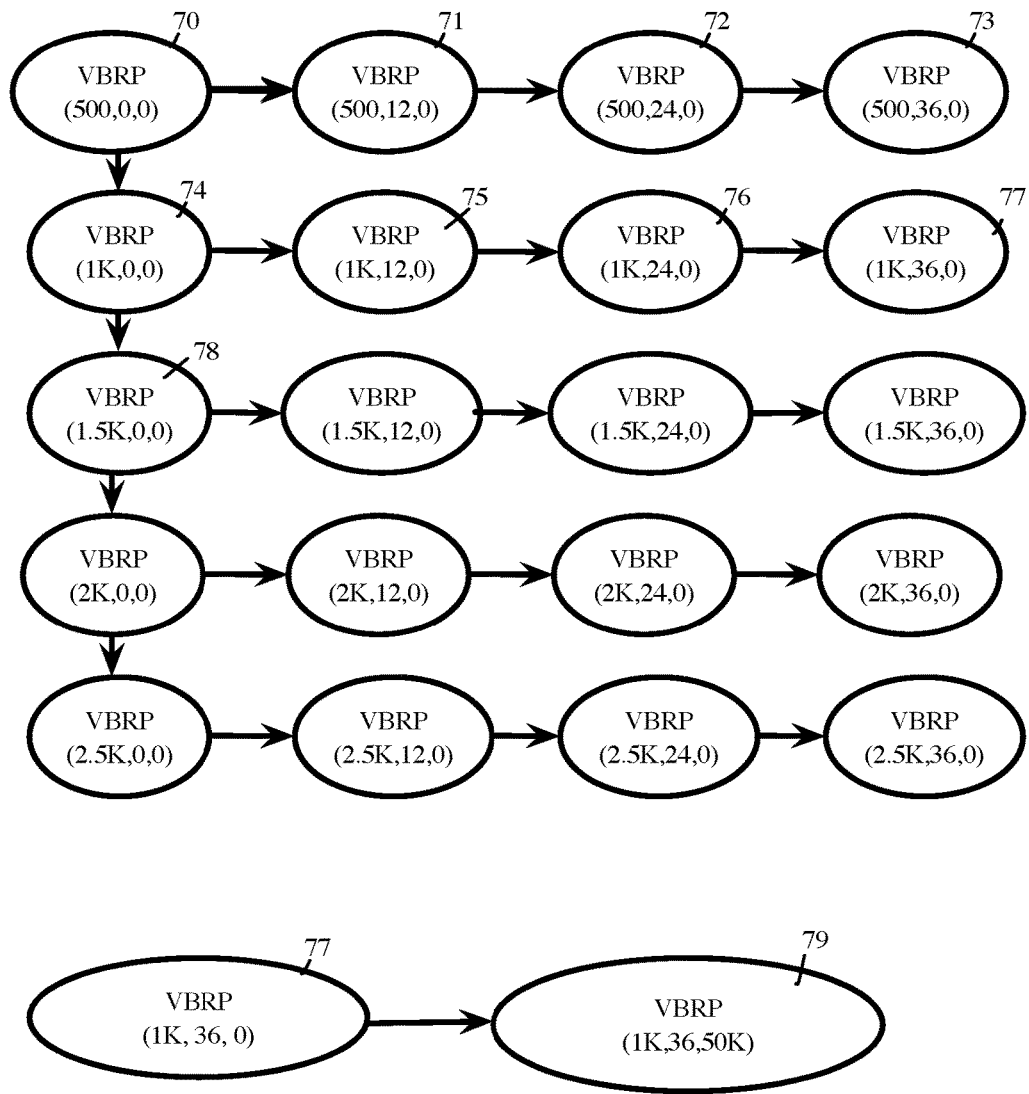
FIG. 9 is a diagram illustrating exemplary background reads in accordance with an embodiment of the invention.

In one embodiment that is illustrated in FIGS. 8-9 the endurance threshold is set at 500 P/E cycles such that every 500 P/E cycles constitutes an endurance event and the retention threshold is set at 12 hours such that a retention timer event occurs after every 12 hours that the block is closed. In this embodiment the read disturb threshold is set at 50,000 reads such that a read disturb event occurs after every 50,000 reads of the block read counter. FIG. 8 shows an exemplary time line and FIG. 9 shows an event matrix that includes the events of FIG. 8 in addition to a number of subsequent events. In the following example, in the term VBRP (x, y, z), x represents the endurance threshold at which VBRP is calculated, y represents the retention time threshold at which VBRP is calculated and z represents the block read threshold at which VBRP is calculated. Each arrow in FIG. 9 represents the starting point for a background reference positioning operation. At 61 the block is open and at 62 the block is closed. In this example the P/E cycle count exceeds 500 when the block is closed 62 so an endurance event 70 is determined to have occurred when the block is closed 62. A background reference positioning operation is performed and the results are stored as both $VBRP_{ENDURANCE}$ and as $VBRP_{RET\_RD}$. After 12 hours from close block 62 a first retention timer event 71 is determined to have occurred (12-hour retention timer event). Since the calculations for retention timer events and read disturb events use $VBRP_{RET\_RD}$ as the starting reference threshold voltage offset in step 202 of FIG. 6, $VBRP_{RET\_RD}$ from the 500 P/E event 70 is used in step 202 to calculate a new updated threshold voltage offset VBRP (500, 12, 0) which is stored as $VBRP_{RET\_RD}$. Upon the occurrence of a second retention timer event 72 (24-hour retention timer event) $VBRP_{RET\_RD}$ from the 12-hour retention timer event 71 is used as the starting reference threshold voltage offset in step 202 of FIG. 6 and the new updated offset value is stored $VBRP_{RET\_RD}$ (500, 24, 0). Similarly, upon the occurrence of a third retention timer event 73 (36-hour retention timer event) $VBRP_{RET\_RD}$ (from the 24-hour retention timer event 72) is used as the starting reference threshold voltage offset in step 202 of FIG. 6 and the new updated offset value is stored as $VBRP_{RET\_RD}$ (500, 36, 0).

At endurance events the VBRP calculated in the most recent endurance event ($VBRP_{ENDURANCE}$) for the page group is used as the starting reference threshold voltage offset in step 202 of FIG. 6. Accordingly, upon the second endurance event 74 (at 1,000 P/E cycles) $VBRP_{ENDURANCE}$ from the 500 P/E event 70 is used as the starting reference threshold voltage offset in step 202.

Upon the occurrence of a retention timer event the most recently calculated updated threshold voltage offset value is used as the starting reference threshold voltage offset in step 202, which can be an updated VBRP calculated in response to the occurrence of an endurance event, a retention timer event or a read disturb event. Since each VBRP calculated from an endurance event is stored as both $VBRP_{RET\_RD}$ and $VBRP_{ENDURANCE}$, the value $VBRP_{RET\_RD}$ always reflects the most recent updated threshold voltage offset for the page group. Accordingly, upon the occurrence of retention timer event 75 (12-hour retention timer event) $VBRP_{RET\_RD}$ from 1K P/E event 74 is used as the starting reference threshold voltage offset in step 202. Upon the occurrence of a second retention timer event 76 (24-hour retention timer event) $VBRP_{RET\_RD}$ (from the 12-hour retention timer event 75) is used as the starting reference threshold voltage offset in step 202 of FIG. 6. Similarly, upon the occurrence of a third retention timer event 77 (36-hour retention timer event) $VBRP_{RET\_RD}$ (from the 24-hour retention timer event 76) is used as the starting reference threshold voltage offset in step 202 of FIG. 6.

Upon the occurrence of a read disturb event 79, the most recently calculated updated threshold voltage offset value is used as the starting reference threshold voltage offset in step 202, which can be an updated VBRP calculated in response to the occurrence of an endurance event, a retention timer event or a read event. Since each VBRP calculated from an endurance event is stored as both $VBRP_{RET\_RD}$ and $VBRP_{ENDURANCE}$, the value $VBRP_{RET\_RD}$ always reflects the most recent updated threshold voltage offset for the page group. Accordingly, at an exemplary 50,000 read-count read disturb event 79 $VBRP_{RET\_RD}$ (1K, 36, 0) is used as the starting threshold voltage offset in step 202 and the resulting VBRP (1K, 36, 50K) is stored as $VBRP_{RET\_RD}$.

In one embodiment, an endurance event is determined to have occurred when the P/E count is greater than the endurance threshold and within an endurance margin (that is added to each endurance threshold). In one exemplary embodiment the endurance margin is 30, so if the P/E is 500-530 P/E cycles, 1,000-1030 P/E cycles, 1500-1530 P/E cycles, etc. an endurance event is determined to have occurred. When performing background reference positioning operations for endurance events, it has been found that better results are obtained when the read count is not too high. Accordingly, in embodiments of the present invention, a limit on the number of read counts is applied when determining whether or not a background reference positioning operation should be performed. In one embodiment, when the number of P/E cycles is within the endurance margin and would otherwise be determined to constitute an endurance event, the calculation of background reference positioning step 117 is not performed when the read count exceeds a quality threshold (e.g., 25,000 reads).

When a block is free 63, previously determined values of $VBRP_{RET\_RD}$ are no longer useful for determining voltage threshold correction. Therefore, the background reference positioning operation 117 immediately following the block erase will use the VBRP calculated in the most recent endurance event ($VBRP_{ENDURANCE}$) for the page group as the starting reference threshold voltage offset in step 202 of FIG. 6, whether it is a VBRP calculation for an endurance event, a retention timer event or a read disturb event. Accordingly, if an endurance event is not determined to have occurred at close block event 65 and a retention or read disturb event 78 is determined to have occurred, $VBRP_{ENDURANCE}$ from the 1,000 P/E event 74 is used as the starting reference threshold voltage in step 202 and the calculated VBRP is stored as $VBRP_{RET\_RD}$.

As previously discussed, after a block is free 63, previously determined values of $VBRP_{RET\_RD}$ are no longer useful. Accordingly, in embodiments of the present invention, when reads are performed after a block is closed and before a first $VBRP_{RET\_RD}$ is determined for the closed block, reads continue to be performed using the VBRP calculated in the most recent endurance event ($VBRP_{ENDURANCE}$) for the page group until the first $VBRP_{RET\_RD}$ is determined following the closed block event.

In one embodiment, upon each close block event (each time that a block is closed) a determination is made as to whether a read disturb event has occurred by determining whether the read count exceeds a block read threshold. In one exemplary embodiment, if the read count is between 50,000 and 100,000, a 50,000-read-count read disturb event is determined to have occurred. If the read count is between 100,000 and 150,000, a 100,000-read-count read disturb event is determined to have occurred.

Following is an exemplary program segment illustrating an exemplary closed block event 65 from FIG. 8 and the calculations performed upon moving from an open block 64 to a closed block 65:

If VBRP$_{ENDURANCE}$ needs to be calculated [i.e. if the cycle count is within 30 P/E cycles of an ENDURANCE event, e.g. at 1500-1530 P/E]
  If RD<25K, then calibrate, then VBRP$_{ENDURANCE}$ and VBRP$_{RET\_RD}$=BRP(1000,0,0) [meaning both registers are overwritten with the result of the calibration]
  Else if 25K<RD<50K, do not calibrate
  Else if 50 k<RD<100K, calibrate by starting from VBRP(1K,0,0), then VBRP$_{RET\_RD}$=VBRP(1K,0,50K)
  Else if 100K<RD<150K, calibrate by starting from VBRP(1K,0,0), then VBRP$_{RET\_RD}$=VBRP(1K,0,100K)
Else [e.g. at 650 P/E cycles]
  If RD<50K, do not calibrate
  Else if 50K<RD<100K, calibrate by starting from VBRP(1K,0,0), then VBRP$_{RET\_RD}$=VBRP(1K,0,50K)
  Else if 100K<RD<150K, calibrate by starting from VBRP(1K,0,0), then VBRP$_{RET\_RD}$=VBRP(1K,0,100K)

Referring now to step 118 of FIG. 5, local reference positioning (LRP) operation is performed by LRP circuit 7 that is operable to calculate and store LRP reference voltage offsets in the background immediately after each calculation of a new set of updated threshold voltage offset values in steps 201-213. In the present embodiment memory storage 4 of FIG. 1 includes a local reference positioning (LRP) table 10 that includes sets of local reference positioning threshold voltage correction values and corresponding index values that identify different combinations of endurance events, retention timer events and read disturb events. In this embodiment local reference positioning (LRP) circuit 7 is operable to identify an index value that corresponds to the endurance events, retention timer events and read disturb events occurring in the closed block and index the LRP table 10 using the identified index value to obtain a local reference positioning correction value. The local reference positioning circuit 7 is then operable to add the local reference position correction value to the most recently determined set of updated threshold voltage offset values to obtain the set of local reference positioning threshold voltage offset values.

In the present embodiment the LRP correction values stored in LRP table 10 include three values, an endurance correction value (SHIFT_A), a retention timing correction value (SHIFT_B) and a read disturb correction value (SHIFT_C) and the LRP circuit 7 is operable to identify either the endurance value, the retention timing correction value or the read disturb correction value and add the identified value to the voltage shift value of each of the threshold voltages in the set of updated threshold voltage offset values corresponding to the page group of the closed block to obtain a first set of local reference positioning threshold voltage offset values. A different one of the endurance value, the retention timing correction value and the read disturb correction value is then identified and is added to the voltage shift value of each of the threshold voltages in the set of updated threshold voltage offset values corresponding to the page group of the closed block to obtain a second set of LRP threshold voltage offset values. The one of the endurance value, the retention timing correction value and the read disturb correction value that has not yet been used is then identified and is added to the voltage shift value of each of the threshold voltages in the set of updated threshold voltage offset values corresponding to the page group of the closed block to obtain a third set of LRP threshold voltage offset values.

Following is a chart illustrating the logic of an exemplary LRP table:

| Endurance | Retention Timing | Read Disturb | FIRST | SECOND | THIRD |
|---|---|---|---|---|---|
| TRUE | FALSE | FALSE | SHIFT_A | SHIFT_B | SHIFT_C |
| TRUE | FALSE | TRUE | SHIFT_A | SHIFT_C | SHIFT_B |
| TRUE | TRUE | TRUE | SHIFT_A | SHIFT_B | SHIFT_C |
| FALSE | TRUE | TRUE | SHIFT_B | SHIFT_C | SHIFT_A |
| FALSE | TRUE | FALSE | SHIFT_B | SHIFT_A | SHIFT_C |
| FALSE | FALSE | TRUE | SHIFT_C | SHIFT_A | SHIFT_B |
| FALSE | FALSE | FALSE | SHIFT_A | SHIFT_B | SHIFT_C |

In one embodiment the values in the LRP table are determined in a test lab by characterizing large numbers of exemplary test NAND devices having the same manufacturer, the same part number, and preferably the same manufacturing batch as NAND devices 20. In one embodiment the conditions in the LRP table are recreated in test NAND devices to identify corresponding voltage shifts that will produce the lowest bit error rate. Shift_A, which may also be referred to as an endurance threshold voltage shift value indicates the effects of the number of P/E cycles being close to the next endurance threshold. Shift_B, which may also be referred to as a retention time threshold voltage shift value indicates the effects of block retention time being close to the next retention time threshold. Shift_C, which may also be referred to as a read disturb threshold shift value indicates the effects of the block read count being close to the next block read threshold. The values for Shift_A, Shift_B and Shift_C represent the change to threshold voltage shift values and may be positive or negative.

LRP circuit 7 is operable to generate an index value that indicates the endurance events, retention timer events and read disturb conditions for the closed block. In one embodiment the endurance index (e.g., a logical "1" or a logical "0") indicates whether the number of P/E cycles for the closed block is closer to the previous endurance threshold or to the next endurance threshold that may be calculated using the following equation P/E>[PE(BRP)+PE$_{STEP}$/2] where P/E is the current number of P/E cycles for the closed block, PE(BRP) is the number of PE cycles in the most recent calculation of VBRP$_{ENDURANCE}$ for the closed block and PE$_{STEP}$/2 is the step size for endurance events (e.g., 500 P/E cycles). In one embodiment the retention timing index (e.g., a logical "1" or a logical "0") indicates whether the retention time for the closed block is closer to the previous retention time threshold or to the next retention time threshold, and may be calculated using the following equation RETENTION_TIME>[RT(BRP)+RT$_{STEP}$/2] where RETENTION_TIME is the current retention time for the closed block, RT(BRP) is the retention time of the most recent calculation of VBRP$_{RET\_RD}$ for the closed block that resulted from a retention event and RT$_{STEP}$/2 is the step size for retention events (e.g., 12 hours). In one embodiment the read disturb index (e.g., a logical "1" or a logical "0") indicates whether the number of reads for the closed block is closer to the previous read disturb threshold or to the next read disturb threshold, and may be calculated using the following equation BLOCK_READ_COUNT>[RD(BRP)+RD$_{STEP}$/2]

where BLOCK_READ_COUNT is the number of reads for the closed block, RD(BRP) is the number of reads of the most recent calculation of $VBRP_{RET\_RD}$ for the closed block that resulted from a read disturb event and $RD_{STEP}/2$ is the step size for read disturb events (e.g., 50,000 reads).

LRP circuit 7 is also operable for indexing the table with the generated index value to identify the one of the local reference positioning correction values to be added to each of the threshold voltage offsets in the set of updated threshold voltage offset values corresponding to the page group of the page being read to obtain the first set of local reference positioning threshold voltage offset values, to identify the one of the local reference positioning correction values to be added to each of the threshold voltages in the set of updated threshold voltage offset values corresponding to the page group of the page being read to obtain the second set of local reference positioning threshold voltage offset values and to identify the one of the local reference positioning correction values to be added to each of the threshold voltage offsets in the set of updated threshold voltage offset values corresponding to the page group of the page being read to obtain the third set of local reference positioning threshold voltage offset values.

In one embodiment there is a single LRP table 10 that is used for identifying local reference positioning correction values. Alternatively, there is a LRP table 10 for each page group and the LRP table 10 that is used to identify local reference position correction values is the LRP table 10 corresponding to the page group for which local reference positioning threshold voltage offsets are being calculated.

In the example shown in FIG. 7, LRP circuit 7 would add a first LRP correction value ($LRP_1$) to each of the threshold voltage offsets in the set of threshold voltage offset values to obtain a first set of LRP correction voltages (e.g., $VLRP_{501-1}=((+2+LRP_{1,1}), (-2+LRP_{1,5})))$. The LRP calculation would then add the second LRP correction value ($LRP_2$) to each of the threshold voltage offsets in the set of threshold voltage offset values to obtain a second set of LRP correction voltages (e.g., $VLRP_{501-2}=((+2+LRP_{2,1}), (-2+LRP_{2,5})))$. The LRP calculation would then add a third LRP correction value ($LRP_3$) to each of the threshold voltage offsets in the set of threshold voltage offset values to obtain a third set of LRP correction voltages (e.g., $VLRP_{501-3}=((+2+LRP_{3,1}), (-2+LRP_{3,5})))$. If the LRP calculation results in an offset that is greater than the maximum offset allowed by the manufacturer of the NAND device 20, the maximum offset allowed for the NAND device 20 is used, and if the LRP calculation results in an offset that is less than the minimum offset allowed by the manufacturer of the NAND device 20, the minimum offset allowed for the NAND device 20 is used.

In one embodiment the LRP correction voltages are concatenated to the set of updated threshold voltage offset values and stored as threshold voltage read parameters (VREAD) for the page group. For example, for page group 501, the threshold voltage read parameters could be expressed as $VREAD_{501}=VBRP_{501}, VLRP_{501-1}, VLRP_{501-2}, VLRP_{501-3}$ with each of $VBRP_{501}, VLRP_{501-1}, VLRP_{501-2}$ and $VLRP_{501-3}$ including a set of two or more threshold voltage offset values.

Referring back to FIG. 5, at least one usage characteristic of a nonvolatile memory device is determined. In the present embodiment the usage characteristic is the number of program and erase cycles and the threshold is a number of program and erase cycles (program and erase cycle threshold). In the embodiment shown in FIG. 1 status circuit 3 is configured to determine usage characteristic(s) of nonvolatile memory devices 20 and to store the determined usage characteristics in in memory storage 4, in one or more NAND device 20 or in a discrete device 13 such as a RAM device.

When the usage characteristic does not meet a usage characteristic (UC) threshold 108 a normal read operation (READ instruction) is performed 109. When the usage characteristic meets a usage characteristic (UC) threshold 108, subsequent reads are performed using a threshold voltage shift read operation that uses a threshold voltage shift read instruction 110.

In the embodiment shown in FIG. 1 read circuit 9 is configured to determine whether a usage characteristic of the nonvolatile memory devices 20 meets a usage characteristic threshold and to perform subsequent host-requested reads of each nonvolatile memory device determined to have a usage characteristic meeting the usage characteristic threshold using a threshold voltage shift read instruction and to perform subsequent host-requested reads of pages of the closed block using the set of updated threshold voltage offset values corresponding to the page group of the page being read.

More particularly, read circuit 9 is configured to determine whether a usage characteristic of the nonvolatile memory devices 20 meets a usage characteristic threshold by querying status circuit 3 to identify the usage characteristic and comparing the identified usage characteristic to a usage characteristic threshold stored in registers or in memory storage 4. In one embodiment the usage characteristic is the number of program and erase cycles for the closed block and normal reads are performed until the number of program and erase cycles for the block have reached a program and erase cycle threshold. In one embodiment a threshold of 600 program and erase cycles is used. In another embodiment the usage characteristic is the BER for the closed block and normal reads are performed until the BER for the closed block have reached a BER threshold.

Once the usage characteristic threshold is reached 108 for a block 22 of a nonvolatile memory device 20 host-requested reads of that block are performed using a threshold voltage shift read operation using a set of updated threshold voltage offset values corresponding to the page group of the page being read, even after the block has become free 115-116, 127. All other blocks continue to be read using a normal read instruction as shown by steps 108-109 and line 129 and using a conventional error recovery operation.

The usage characteristic threshold is chosen so as to move from performing a normal read operation 109 to a threshold voltage shift read 110 before a read using a normal read instruction 109 results in a decode failure, requiring error recovery operation. Thereby, the latency from the read using the normal read instruction 109 and the latency of the resulting error recovery operation is avoided. More particularly, conventional read failure processes require two reads to recover the codeword, the normal read and the read of a subsequent error recovery read retry, resulting in significant latency. By setting the usage characteristic threshold at a bit error rate below the bit error rate where decode errors from the NAND device 20 reach the uncorrectable bit error rate, the latency that would have occurred as a result of using a normal read instruction 109 is avoided, providing a method and apparatus with reduced latency and extending the useful lifetime of nonvolatile memory devices 20.

In one embodiment, when a usage characteristic is determined to meet the usage characteristic threshold 108, all subsequent host-requested reads of pages of the closed block are performed using a threshold voltage shift read instruction using a set of updated threshold voltage offset values corresponding to the page group of the page being read using $VBRP_{RET\_RD}$ when the block is closed or $VBRP_{ENDURANCE}$ when the block is not closed. Thereby, while the block is closed the temporary variations in voltage threshold from retention time and from read disturb of the block are taken into account in reads, and after the block has been erased these temporary variations in voltage threshold are no longer considered until the block is again opened. At times other than when the block is open the more permanent effects of aging, as indicated by the number of P/E cycles is used in reads. Thereby, the number of read errors is reduced. Furthermore, BER is reduced, extending the time that each NAND device can operate before uncorrectable errors start to occur and thereby extending the useful life of nonvolatile memory controller 1.

In an alternate embodiment the usage characteristic threshold is a block group threshold (e.g., determining the number of P/E cycles for all blocks in a block group or the greatest number of P/E cycles for any block in the group and comparing it to a corresponding block group P/E threshold), and all subsequent reads of blocks in the block group meeting the usage characteristic threshold are performed using a threshold voltage shift read instruction.

In one embodiment, when a usage characteristic is determined to meet the usage characteristic threshold 108, all subsequent reads of pages of the closed block are performed using a threshold voltage shift read instruction using a set of updated threshold voltage offset values corresponding to the page group of the page being read. Accordingly, all subsequent host-requested reads and all subsequent housekeeping operation reads on pages of the closed block are performed using a threshold voltage shift read operation using a set of updated threshold voltage offset values corresponding to the page group of the page being read using $VBRP_{RET\_RD}$ when the block is closed or using $VBRP_{ENDURANCE}$ when the block is not closed.

Read circuit 9 is operable to perform reads using threshold voltage shift read instructions by indexing the BRP table with an index value corresponding to the page that is being read to obtain threshold voltage shift read parameters to use in the threshold voltage shift read operation (updated threshold voltage offset values and LRP threshold voltages for the page group of the page being read) that are used to generate corresponding threshold voltage shift read instructions that are sent to the NAND 20 device to be read.

In an alternate embodiment memory storage 4 includes more than one BRP table, with a first table (page group table) including index values identifying pages and indexes identifying the corresponding page group. A second table (BRP-page group table) includes index values identifying page groups and corresponding threshold voltage shift read parameters. In this embodiment, to perform a threshold voltage shift read, read circuit 9 is operable to index the page group table using an index value that identifies the page that is to be read to obtain an index value that identifies the page group of the page that is to be read. The index value of the page group is then used to index the BRP-page group table to obtain the threshold voltage shift read parameters to be used in the read operation.

When a decode failure 111 of a read of a page of the closed block occurs, a local reference positioning read operation is performed 112 by reading the failed page with a threshold voltage shift read operation using a set of the LRP threshold voltage offset values for the page group of the failed page. If the decode of step 111 fails the number of failures is determined and is compared to a local reference positioning (LRP) limit 113, and local reference positioning reads continue to be performed as shown by steps 112-113 until the LRP limit is reached. After the LRP limit is reached a conventional error recovery operation is performed 114. The conventional error recovery operation 114 can be, for example, soft reads or/and a RAID operation.

In the present embodiment read circuit 9 is operable to perform steps 111-113. More particularly, read circuit 9 received a first set of LRP threshold voltage offsets, a second set of LRP threshold voltage offsets, and a third set of LRP threshold voltage offsets and the set of updated threshold voltage offset values for the failed page prior to performing the read of step 110. On the first decode failure 111, read circuit 9 is operable for reading the failed page with a threshold voltage shift read operation using the first set of LRP threshold voltage offset values for the page group of the failed page. On the second decode failure 111, read circuit 9 is operable for reading the failed page with a threshold voltage shift read operation using the second set of LRP threshold voltage offset values for the page group of the failed page. On the third decode failure 111, read circuit 9 is operable for reading the failed page with a threshold voltage shift read operation using the third set of LRP threshold voltage offset values for the page group of the failed page. In the present embodiment a local reference positioning limit of three is used in step 113. Though the present embodiment uses three sets of LRP threshold voltage offset values, in other embodiment more or fewer sets of LRP threshold voltage offset values may be used.

In the present embodiment every time that a read with a threshold voltage shift read instruction of step 110 fails, the local preference positioning read process of steps 112-114 is used. Accordingly, when a usage characteristic is determined to meet the usage characteristic threshold 108, all subsequent reads of pages of the closed block are performed using a threshold voltage shift read instruction using a set of updated threshold voltage offset values corresponding to the page group of the page being read and all failures of the subsequent reads of pages of the closed block use the error recovery process of steps 112-114. In embodiments in which all subsequent host-requested reads of pages of the closed block are performed using a threshold voltage shift read instruction using a set of updated threshold voltage offset values corresponding to the page group of the page being read all failures of the subsequent host-requested reads of pages of the closed block use the error recovery process of steps 112-114.

In one embodiment the method of FIG. 5 includes storing a local reference positioning table that includes a plurality of local reference positioning correction values and determining the order in which the plurality of local reference positioning correction values are to be applied to decode failures by determining whether the current number of program and erase cycles for the page being read is near the next endurance threshold, determining whether the current read count for the page being read is near the next read disturb threshold and whether the current retention time is near the next retention time threshold. Based on the determined order, a first one of the local reference positioning correction values is added to each of the threshold voltage offsets in the set of updated threshold voltage offset values corresponding to the page group of the page being read to obtain a first set of local reference positioning threshold voltage offset values. Based on the determined order, a second one of the local reference positioning correction values is added to each of the threshold voltage offsets in the set of updated threshold voltage offset values corresponding to the page group of the page being read to obtain a second set of local reference positioning threshold voltage offset values. Based on the determined order, a third one of the local reference positioning correction values is added to each of the threshold voltage offsets in the set of updated threshold voltage offset values corresponding to the page group of the page being read to obtain a third set of local reference positioning threshold voltage offset values. Upon a first decode failure of a read of the page being read, the failed page is read using the first set of local reference positioning threshold voltage offset values. Upon a second decode failure of a read of the page being read, the failed page is read using the second set of local reference positioning threshold voltage offset values. Upon a third decode failure of a read of the page being read, the failed page is read using the third set of local reference positioning threshold voltage offset values.

By using local reference positioning table 10 to determine which LRP correction value is to be added to generate the first, second and third sets of local reference positioning threshold voltage offsets, local reference positioning circuit 7 identifies the most likely to be successful LRP threshold voltage correction value for use in the first read, the second most likely in the second read and the third most likely in the third read. Furthermore, since the correction value that is used first will correspond most closely to the current conditions for the particular block of the NAND device being read, the likelihood of the first local reference positioning read 112 being successful is much greater than that of error recovery operations in prior art systems that do not take into account local conditions. Therefore, fewer error-recovery related read operations are required as compared to error recovery operations in prior art systems, resulting in decreased latency.

Even though the methods of FIGS. 5-6 take into account local differences, there is always the possibility of a local condition that is not corrected by the methods of FIGS. 5-6 and that does not correspond to the expected error pattern. These local conditions must be identified as soon as possible to avoid too much use of error recovery, which would increase latency. It has been found that certain pages of each block tend to experience failure before other pages. For example, it has been found that word line 124 of each block tends to experience failure before other pages of each block, making pages stored in word line 124 a good indicator of the health of the block. In the embodiment shown in FIG. 10 an indicator page, such as, for example, word line 24 is used to identify these local conditions.

Figure 10:
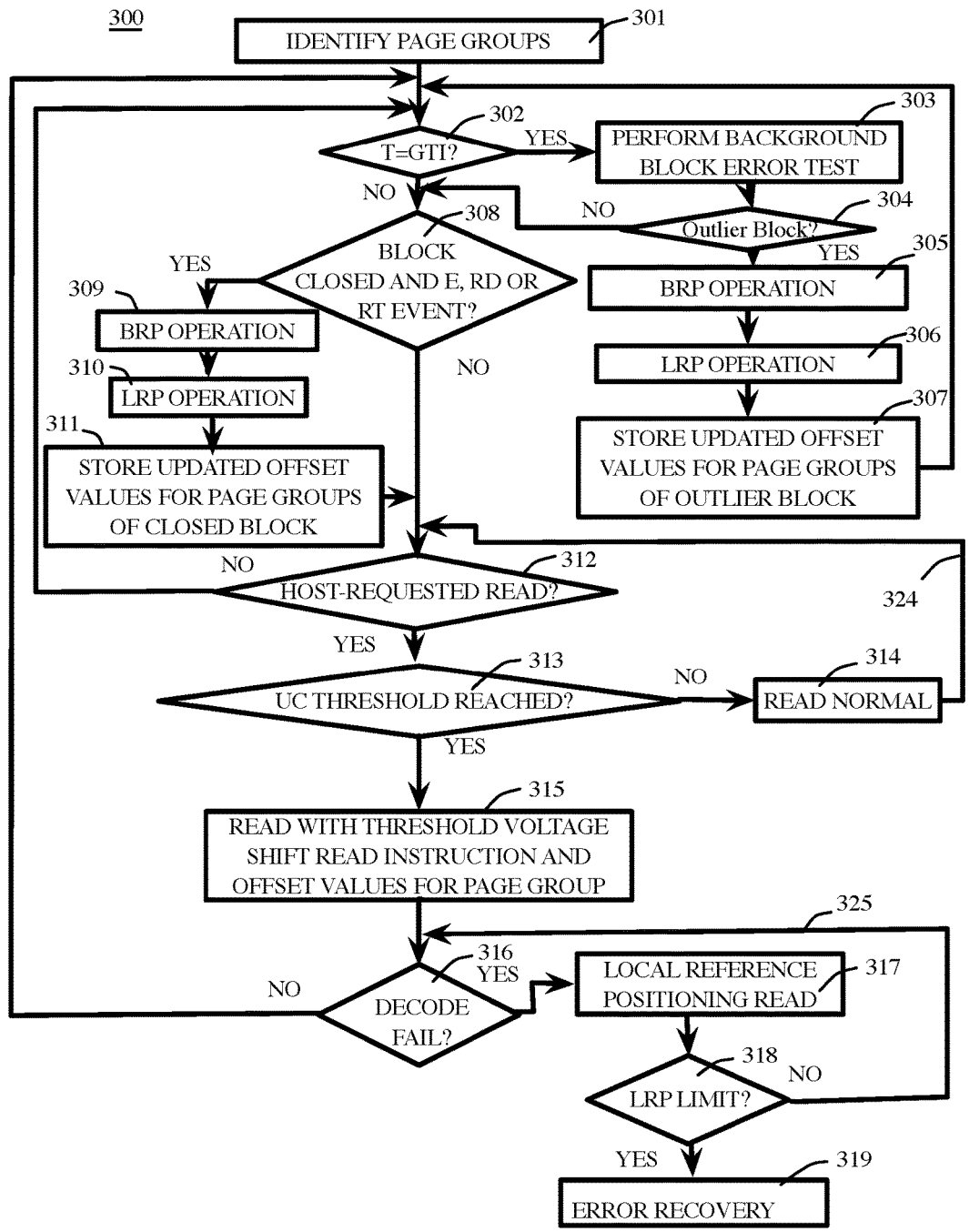
FIG. 10 is a diagram illustrating a method for reducing latency of reads of nonvolatile memory devices that identifies outliers and generates updated threshold voltage offset values for page groups of blocks identified as outliers in accordance with an embodiment of the invention.

In the embodiment shown in FIG. 10 a method 300 is disclosed in which outlier blocks are identified as shown by steps 302-304. More particularly, time (T) is determined, such as by using a system clock or other timing device available to nonvolatile memory controller 11 and each time that the time reaches the predetermined timing interval 302, that may be referred to as a global timing interval (GTI), a background block error test 303 is performed of all blocks of all nonvolatile memory devices 20. In one embodiment a timing interval of two hours is used such that background read of an indicator page of each block of each nonvolatile memory device 20 is performed every two hours. The number of errors in the background read of the indicator page is determined by decoder circuit 8 and is compared to an error threshold. If the number of errors in the background read of an indicator page of a exceeds the error threshold, the block is identified as an "outlier block" in step 304. An "outlier block," is any block having a number of errors exceeding the error threshold. The error threshold represents the expected number of errors (e.g., BER) and may be one or more values stored in nonvolatile memory system 1 that reflect the expected error rate at one or more specific point in the lifetime of the nonvolatile memory devices 20. In one embodiment a table is stored with error thresholds and corresponding P/E cycles so that an error threshold can be chosen that corresponds to the age of the device 20 being tested.

Once a block is identified as an outlier block, background reference partitioning operations 305 and local reference partitioning operations 306 are performed to identify a set of threshold voltage shift read parameters to be used in subsequent reads of the outlier block in the same manner as disclosed in methods 5-6. More particularly, in step 305 background reads of representative pages of each page group of the outlier block are performed at offsets to each threshold voltage that is required for reading the representative pages of each page group of the outlier block to identify a set of updated threshold voltage offset values for each page group of the outlier block and in step 306 local reference positioning threshold voltage offset values are determined and the BRP and LRP threshold voltage offset values are stored as shown by step 307. In one embodiment the results of the background reference positioning operation 305 are stored as a $VBRP_{ENDURANCE}$ value. The results may also be stored as a $VBRP_{RET\_RD}$ value.

In the present embodiment local reference positioning operations 306 are performed by determining the order in which a set of local reference positioning correction values are to be applied to decode failures by determining whether the current number of program and erase cycles for the page being read is near the next endurance threshold, determining whether the current read count for the page being read is near the next read disturb threshold and whether the current retention time is near the next retention time threshold, and based on the determined order, adding local reference positioning correction values to each of the threshold voltages in the set of updated threshold voltage offset values obtained in step 305 to obtain sets of local reference positioning threshold voltage offset values in step 306 for each page group of the outlier block.

As shown by steps 308-310 background reference positioning operations 309 and local reference positioning operations 310 are performed on the occurrence of one or more of an endurance (E) event, a retention timer (RT) event and a read disturb (RD) event at a closed block to identify a set of updated threshold voltage offset values for each page group of the closed block in the same manner as in FIGS. 5-6. In the embodiment shown in FIG. 1, read circuit 9 is configured to perform a background read of an indicator page of each block of the nonvolatile memory device at a predetermined timing interval to identify outlier blocks. In this embodiment background reference positioning circuit 6 is configured to perform background reads of representative pages of each page group of the outlier block at offsets to each threshold voltage that is required for reading the representative pages of the outlier block to identify a set of updated threshold voltage offset values for the outlier block in addition to performing background reference positioning operations upon the occurrence of one or more of an endurance event, a retention timer event and a read disturb event at a closed to identify a set of updated threshold voltage offset values for each page group of the closed block and the results from steps 309-310 are stored in step 311.

Each time that a host-requested read operation is performed a normal read will be used as shown by block 314 and line 324 until one or more usage characteristic is determined to meet one or more usage characteristic threshold. Upon meeting the one or more usage characteristic threshold, all subsequent host-requested reads of pages of each block meeting the one or more usage characteristic threshold are performed using a threshold voltage shift read instruction and using the set of updated threshold voltage offset values corresponding to the page group of the page being read as shown by step 315. In the present embodiment read circuit 9 is configured to determine whether a usage characteristic meets one or more usage characteristic threshold and, when the usage characteristic is determined to meet the one or more usage characteristic threshold, the read circuit 9 is configured to perform subsequent host-requested reads of pages of each block meeting the one or more usage characteristic threshold using a threshold voltage shift read instruction and using the set of updated threshold voltage offset values corresponding to the page group of the page being read.

Any page identified as an outlier page in step 304 will be determined to meet a usage characteristic and all subsequent host-requested reads of outlier blocks will be performed using a threshold voltage shift read operation as shown by step 315. In this embodiment a first usage characteristic is the number of errors in the background read of the indicator page and a first usage characteristic threshold is the error threshold. Accordingly, the usage characteristic will meet the one or more usage characteristic threshold when the number of errors in any background read of an indicator page of the block exceeds the error threshold.

In the present embodiment a usage characteristic such as the number of program and erase cycles is used in the same manner as discussed in FIG. 5 to determine whether the blocks not identified as outlier blocks should be read with a threshold voltage shift read instruction in step 315. More particularly, in one embodiment the number of program and erase cycles is used as a second usage characteristic and is compared to a program and erase cycle threshold, with the usage characteristic determined to meet usage characteristic threshold when the number of program and erase cycles of the block exceeds the number of program and erase cycles of the program and erase cycle threshold.

Upon a decode failure as shown by steps 316-318, 325 the failed page is read 317 until the number of local reference positioning reads 317 reaches the local reference positioning limit as shown by step 113. Then, a conventional decode failure operation is performed 319. More particularly, the failed page is read 317 a using the sets of local reference positioning threshold voltage offset values for the page group of the page being read in the order determined in the local reference positioning operation 306, 310 to correct decode failures until the maximum number of decode failures have been reached as shown by step 318. In the present embodiment the process of steps 316-319 is performed in the same manner as described in the methods of FIGS. 5-6.

The use of both background reference positioning and local reference positioning results in fewer decode errors and hence fewer soft read operations, providing a nonvolatile memory system 1 with reduced latency as compared to systems that use conventional read operations. Moreover, BER is reduced, extending the lifetime of nonvolatile memory system 1.

In various embodiments, the system of the present invention may be implemented in a Field Programmable Gate Array (FPGA) or Application Specific Integrated Circuit (ASIC).

In an alternate embodiment of the present invention the threshold voltage shift read instructions of step 110 are performed whether or not a UC threshold is reached in step 110, and such embodiments may include some or all of steps 100-107 and 109-118. For example, the reads of step 110 may be performed during the entire lifetime of the nonvolatile memory device, or only after some other triggering event, which may be, without limitation, a global timing event.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims and not by the above detailed description.

What is claimed is:

1. A method for reducing latency of a nonvolatile memory controller comprising:
    identifying a plurality of page groups in each block of a nonvolatile memory device;
    performing a background read of an indicator page of each block of the nonvolatile memory device at a predetermined timing interval;
    determining the number of errors in the background read of the indicator page of each block;
    identifying a block having a determined number of errors exceeding an error threshold as an outlier block;
    performing background reads of representative pages of each page group of the outlier block at offsets to each threshold voltage that is required for reading the representative pages of each page group of the outlier block to identify a set of updated threshold voltage offset values for each page group of the outlier block;
    upon the occurrence of one or more of an endurance event, a retention timer event and a read disturb event at a closed block, performing background reads of representative pages of each page group of the closed block at offsets to each threshold voltage that is required for reading the representative pages of each page group of the closed block to identify a set of updated threshold voltage offset values for each page group of the closed block; and
    when a usage characteristic is determined to meet one or more usage characteristic threshold, performing subsequent host-requested reads of pages of each block meeting the one or more usage characteristic threshold using a threshold voltage shift read instruction and using the set of updated threshold voltage offset values corresponding to the page group of the page being read.

2. The method of claim 1 wherein a first usage characteristic is the number of errors in the background read of the indicator page and wherein a first usage characteristic threshold is the error threshold, and wherein the usage characteristic is determined to meet the one or more usage characteristic threshold when the number of errors in any background read of an indicator page of the block exceeds the error threshold.

3. The nonvolatile memory controller of claim 2 further comprising a second usage characteristic that comprises a number of program and erase cycles and a second usage characteristic threshold that is a program and erase cycle threshold, and wherein the usage characteristic is determined to meet the one or more usage characteristic threshold when the number of program and erase cycles of the block exceeds the number of program and erase cycles of the program and erase cycle threshold.

4. The method of claim 1 further comprising:
storing a local reference positioning table that includes a plurality of local reference positioning correction values;
determining the order in which the plurality of local reference positioning correction values are to be applied to decode failures by determining whether the current number of program and erase cycles for the page being read is near the next endurance threshold, determining whether the current read count for the page being read is near the next read disturb threshold and whether the current retention time is near the next retention time threshold;
based on the determined order, adding a first one of the local reference positioning correction values to each of the threshold voltages in the set of updated threshold voltage offset values corresponding to the page group of the page being read to obtain a first set of local reference positioning threshold voltage offset values;
based on the determined order, adding a second one of the local reference positioning correction values to each of the threshold voltages in the set of updated threshold voltage offset values corresponding to the page group of the page being read to obtain a second set of local reference positioning threshold voltage offset values;
based on the determined order, adding a third one of the local reference positioning correction values to each of the threshold voltages in the set of updated threshold voltage offset values corresponding to the page group of the page being read to obtain a third set of local reference positioning threshold voltage offset values;
upon a first decode failure of a read of the page being read reading the failed page using the first set of local reference positioning threshold voltage offset values;
upon a second decode failure of a read of the page being read reading the failed page using the second set of local reference positioning threshold voltage offset values; and
upon a third decode failure of a read of the page being read reading the failed page using the third set of local reference positioning threshold voltage offset values.

5. The method of claim 4 wherein the method further comprises:
summing the errors from each read at an offset to a threshold voltage;
determining the error sum having the least number of errors; and
identifying the set of updated threshold voltage offset values to include the threshold voltage offset value corresponding to the error sum determined to have the least number of errors.

6. A nonvolatile memory controller comprising:
a status circuit configured to determine a usage characteristic of a nonvolatile memory device that includes a plurality of blocks, each block including a plurality of page groups; and
a read circuit coupled to the status circuit and configured to perform a background read of an indicator page of each block of the nonvolatile memory device at a predetermined timing interval to identify outlier blocks, wherein a block is identified as outlier block when the number of errors in the background read of an indicator page of the block exceeds an error threshold;
a background reference positioning circuit coupled to the read circuit, the background reference positioning circuit configured to perform background reads of representative pages of each page group of the outlier block at offsets to each threshold voltage that is required for reading the representative pages of the outlier block to identify a set of updated threshold voltage offset values for each page group of the outlier block, and upon the occurrence of one or more of an endurance event, a retention timer event and a read disturb event at a closed block the read circuit is further configured to perform background reads of representative pages of each page group of the closed block at offsets to each threshold voltage that is required for reading the representative pages of each page group of the closed block to identify a set of updated threshold voltage offset values for each page group of the closed block; and
wherein the read circuit is configured to determine whether a usage characteristic meets one or more usage characteristic threshold and, when the usage characteristic is determined to meet the one or more usage characteristic threshold, the read circuit is configured to perform subsequent host-requested reads of pages of each block meeting the one or more usage characteristic threshold using a threshold voltage shift read instruction and using the set of updated threshold voltage offset values corresponding to the page group of the page being read.

7. The nonvolatile memory controller of claim 6 wherein a first usage characteristic of the one or more usage characteristics is the number of errors in the background read of the indicator page and wherein a first usage characteristic threshold is the error threshold, and wherein the one or more usage characteristic is determined to meet the one or more usage characteristic threshold when the number of errors in any background read of an indicator page of the block exceeds the error threshold.

8. The nonvolatile memory controller of claim 7 further comprising a second usage characteristic that comprises a number of program and erase cycles and a second usage characteristic threshold that is a program and erase cycle threshold, and wherein the usage characteristic is determined to meet the one or more usage characteristic threshold when the number of program and erase cycles of the block exceeds the number of program and erase cycles of the program and erase cycle threshold.

9. The nonvolatile memory controller of claim 8 wherein the local reference positioning correction values include an endurance correction value, a retention timing correction value and a read disturb correction value, and wherein the local reference positioning circuit is operable to add one of the local reference positioning correction values to each of the threshold voltages in the set of updated threshold voltage offset values corresponding to the page group of the page being read to obtain the first set of local reference positioning threshold voltage offset values and further wherein the local reference positioning circuit is operable to add a different one of the endurance correction value, the retention timing correction value and the read disturb correction value to each of the offset values in the set of updated threshold voltage offset values corresponding to the page group of the page being read to obtain a second set of local reference positioning threshold voltage offset values, and further wherein the read circuit is operable upon a second decode failure to read the failed page using the second set of local reference positioning offset values.

10. The nonvolatile memory controller of claim 6 further comprising memory storage configured to store a background reference positioning table that includes each of the identified sets of updated threshold voltage offset values and corresponding index values and wherein the read circuit is configured to identify threshold voltage offset values to be used in the subsequent host-requested reads by indexing the background reference positioning table using an index value corresponding to the page group of the page being read.

11. The nonvolatile memory controller of claim 6 wherein the memory storage is further configured to store a plurality of local reference positioning correction values, the nonvolatile memory controller further comprising:
   a local reference positioning circuit coupled to the read circuit and operable to add one of the local reference positioning correction values to each of the threshold voltage offset values in the set of updated threshold voltage offset values corresponding to the page group of the page being read to obtain a first set of local reference positioning offset values; and
   wherein the read circuit is operable upon a first decode failure to read the failed page using the first set of local reference positioning offset values.

12. The nonvolatile memory controller of claim 6 wherein blocks of the nonvolatile memory device are grouped into a plurality of block groups and wherein pages within each block group are grouped into a plurality of page groups.

13. The nonvolatile memory controller of claim 12 wherein the status circuit is operable to determine closed block retention time for each closed block of the nonvolatile memory device, and wherein the background reference positioning circuit is configured to determine that a retention timer event has occurred each time that the closed block retention time reaches a threshold retention time.

14. The nonvolatile memory controller of claim 13 wherein the status circuit is operable to determine a number of reads for each block of the nonvolatile memory device and wherein the background reference positioning circuit is configured to determine that a read disturb event has occurred each time that the number of reads for the closed block reaches a threshold number of reads.

15. The nonvolatile memory controller of claim 6 wherein the read circuit is operable to assign priority values to read instructions and is operable to perform the background reads by assigning a lower priority to background read instructions than the priority assigned to read instructions generated in response to read requests from a host computing device.

16. A nonvolatile memory system comprising:
   a plurality of nonvolatile memory devices that each include a plurality of blocks, each block including a plurality of page groups;
   a memory controller coupled to each of the nonvolatile memory devices, the memory controller configured to perform program operations and read operations on memory cells of the nonvolatile memory devices, the nonvolatile memory controller comprising:
   a status circuit configured to determine a usage characteristic of a nonvolatile memory device; and
   a read circuit coupled to the status circuit and configured to perform a background read of an indicator page of each block of the nonvolatile memory device at a predetermined timing interval to identify outlier blocks, wherein a block is identified as outlier block when the number of errors in the background read of the indicator page exceeds an error threshold;
   a background reference positioning circuit coupled to the read circuit, the background reference positioning circuit configured to perform background reads of representative pages of each page group of the outlier block at offsets to each threshold voltage that is required for reading the representative pages of the outlier block to identify a set of updated threshold voltage offset values for the outlier block, and upon the occurrence of one or more of an endurance event, a retention timer event and a read disturb event at a closed block the read circuit is further configured to perform background reads of representative pages of each page group of the closed block at offsets to each threshold voltage that is required for reading the representative pages of each page group of the closed block to identify a set of updated threshold voltage offset values for each page group of the closed block; and
   wherein the read circuit is configured to determine whether a usage characteristic meets one or more usage characteristic threshold and, when the usage characteristic is determined to meet the one or more usage characteristic threshold, the read circuit is configured to perform subsequent host-requested reads of pages of each block meeting the one or more usage characteristic threshold using a threshold voltage shift read instruction and using the set of updated threshold voltage offset values corresponding to the page group of the page being read.

17. The nonvolatile memory system of claim 16 wherein a first usage characteristic is the number of errors in the background read of the indicator page and wherein a first usage characteristic threshold is the error threshold, and wherein the usage characteristic is determined to meet one or more usage characteristic threshold when the number of errors in any background read of a representative page of a block exceeds the error threshold.

18. The nonvolatile memory system of claim 17 further comprising memory storage configured to store a background reference positioning table that includes each of the identified sets of updated threshold voltage offset values and corresponding index values and wherein the read circuit is configured to identify threshold voltage offset values to be used in the subsequent host-requested reads by indexing the background reference positioning table using an index value corresponding to the page group of the page being read.

19. The nonvolatile memory system of claim 16 further comprising memory storage configured to store a plurality of local reference positioning correction values, the nonvolatile memory controller further comprising:
   a local reference positioning circuit coupled to the read circuit and operable to add one of the local reference positioning correction values to each of the threshold voltage offset values in the set of updated threshold voltage offset values corresponding to the page group of the page being read to obtain a first set of local reference positioning offset values; and
   wherein the read circuit is operable upon a first decode failure to read the failed page using the first set of local reference positioning offset values.

20. The nonvolatile memory system of claim 19 wherein the local reference positioning correction values include an endurance correction value, a retention timing correction value and a read disturb correction value, and wherein the local reference positioning circuit is operable to add one of the local reference positioning correction values to each of the threshold voltages in the set of updated threshold voltage offset values corresponding to the page group of the page being read to obtain the first set of local reference positioning threshold voltage offset values and further wherein the local reference positioning circuit is operable to add a different one of the endurance correction value, the retention timing correction value and the read disturb correction value to each of the offset values in the set of updated threshold voltage offset values corresponding to the page group of the page being read to obtain a second set of local reference positioning threshold voltage offset values, and further wherein the read circuit is operable upon a second decode failure to read the failed page using the second set of local reference positioning offset values.

\* \* \* \* \*